United States Patent [19]
Yamada

[11] Patent Number: 5,849,605
[45] Date of Patent: Dec. 15, 1998

[54] TWO-PHASE CLOCK TYPE CHARGE COUPLED DEVICE HAVING ELECTRODES WITH TAPERED SIDEWALLS AND METHOD FOR PRODUCING THE SAME

[75] Inventor: Tohru Yamada, Tokyo, Japan

[73] Assignee: NEC Corporation, Tokyo, Japan

[21] Appl. No.: 844,653

[22] Filed: Apr. 21, 1997

[30] Foreign Application Priority Data

Apr. 19, 1996  [JP]  Japan ..................................... 8-098561

[51] Int. Cl.⁶ .......................... H01L 21/00; H01L 21/339; H01L 21/336; H01L 21/425
[52] U.S. Cl. .............................. 438/60; 438/75; 438/144; 438/302; 438/525
[58] Field of Search ................................ 438/60, 75, 144, 438/145, 146, 147, 148, 525, 302, 306

[56] References Cited

U.S. PATENT DOCUMENTS

| | | | |
|---|---|---|---|
| 3,873,371 | 3/1975 | Wolf | 148/1.5 |
| 3,908,262 | 9/1975 | Stein | 29/579 |
| 3,914,857 | 10/1975 | Goser et al. | 29/579 |
| 3,967,365 | 7/1976 | Friedrich | 29/579 |
| 4,178,396 | 12/1979 | Okano et al. | 427/93 |
| 4,227,202 | 10/1980 | Tasch, Jr. et al. | 357/24 |
| 4,239,559 | 12/1980 | Ito | 148/188 |
| 5,221,852 | 6/1993 | Nagai et al. | 257/221 |
| 5,397,730 | 3/1995 | Hojo et al. | 437/53 |
| 5,578,511 | 11/1996 | Son | 437/35 |
| 5,641,989 | 6/1997 | Tomioka | 257/630 |

FOREIGN PATENT DOCUMENTS

A8222725  8/1996  Japan .

*Primary Examiner*—Brian Dutton
*Attorney, Agent, or Firm*—Sughrue, Mion, Zinn, Macpeak & Seas, PLLC

[57] ABSTRACT

In a charge coupled device (CCD) comprising a semiconductor substrate having a channel layer therein and a gate insulator thereon, a plurality first electrodes arranged in charge transfer direction on the gate insulator with inter-electrode spaces defined by opposite sidewalls of the first electrodes, an interlayer insulators covering the outer surfaces including the sidewalls of the first electrodes, a plurality of second electrodes formed at the inter-electrodes spaces, and a potential barrier region formed in the channel layer under the inter-electrode spaces, each of the sidewalls are tapered to diverge the inter-electrode space upwardly from the gate insulator so that each of the first electrodes has a thin portion at the tapered sidewall. In boron injection to form the potential barrier region using the first electrodes as a mask. boron is injected through the inter-electrode space and also penetrates the thin portion of the sidewall, so that the potential barrier region is extended into the portion under the tapered sidewall. The potential barrier region is further expanded by obliquely injecting boron forwardly and reversely in the charge transfer direction, to thereby provide a high speed CCD with a low drive voltage with generation of no potential pocket. It is further enhanced by use of an energy at the forward injection higher than at the other injection reversely in the charge transfer direction.

5 Claims, 21 Drawing Sheets

CHARGE TRANSFER
DIRECTION
←

CHARGE TRANSFER
DIRECTION
←

CHARGE TRANSFER
DIRECTION
←

CHARGE TRANSFER DIRECTION

CHARGE TRANSFER
DIRECTION
←

TWO-PHASE CLOCK TYPE CHARGE COUPLED DEVICE HAVING ELECTRODES WITH TAPERED SIDEWALLS AND METHOD FOR PRODUCING THE SAME

BACKGROUND OF THE INVENTION

This invention relates to a charge coupled device for use as a solid image pickup device or memory device and, more particularly, to a two-phase clock type charge coupled device and a method for producing the same.

In recent years, a development has been made of small-sized image input devices having an increased number of picture elements or pixels, such as video cameras for a high-precision television system, digital still cameras and others. Those image input devices requires development of the charge coupled devices (which will be abbreviated as "CCD" hereinafter) of low power consumption for use as image sensors therein. Especially, it is expected in a horizontal CCD of a high drive-clock frequency to reduce the drive voltage. Since the horizontal CCD is required to transfer a signal charge at a high speed, a two-phase clock type CCD with a two-layer electrode structure is generally used as the horizontal CCD.

The two-phase clock type CCD comprises a semiconductor substrate having a substrate surface and an array of electric charge storage regions and potential barrier regions alternately formed in the substrate surface.

In the substrate surface, a channel layer of a first conductive type is formed and a gate insulating layer overlies the channel layer. A composite electrode structure or the two-layer electrode structure is formed on the gate insulating layer.

The composite electrode structure comprises a plurality of first electrodes formed with an inter-electrode space left between adjacent ones on the gate insulating layer. Each of the first electrodes has opposite sidewalls. One of the side walls of one of the first electrodes faces one of the sidewalls of adjacent one of the first electrodes with the inter-electrode space therebetween. On the first electrodes, a plurality of interlayer insulating layer are formed to extend onto the sidewalls, respectively. A plurality of second electrodes are formed on the gate insulating layer within the inter-electrode spaces. Each of the first electrodes and each of the second electrodes are disposed adjacent to one each other with an insulating gap therebetween on the gate insulating layer. A plurality of potential barrier layers are formed in the channel layer under the second electrodes, respectively. Each of the potential barrier layers has an impurity concentration lower than the channel layer.

In operation, each one of the first electrodes and the adjacent one of the second electrodes constitute a pair of electrodes connected to each other as a transfer electrode pair. Two adjacent pairs of electrodes are driven by two drive-clocks of the same frequency but different in phase. So that an electric charge is transferred in the channel layer from one region to the next region in a charge transfer direction along the array.

In a known structure of the two-phase clock type CCD, the potential barrier layer is not formed in the channel layer under each of the insulating gaps between the first and the second electrodes. Therefore, there is a problem that a potential dip or pocket tends to occur in the channel layer under the insulating gap to thereby degrade the charge transfer efficiency, especially at drive by the clocks of voltage of 3 V or less.

In order to resolve the problem, JP-A-8 222725 proposed a CCD wherein the potential barrier layer extends under the first electrode about 0.1 $\mu$m from the sidewall of the first electrode. However, it is not sufficient to inhibit formation of the potential dip or pocket.

SUMMARY OF THE INVENTION

It is an object of this invention to provide a charge coupled device of a two-phase clock type wherein a signal charge can be transferred with a high efficiency at high speed even by a low voltage drive.

It is another object of this invention to provide a method of the charge coupled device of the two-phase clock type.

According to the present invention, there is obtained a two-phase clock type charge coupled device for transferring a signal charge in a charge transfer direction, comprising: a semiconductor substrate having a substrate surface; a channel layer of a first conduction type formed in the substrate surface; a gate insulating layer overlying the channel layer; a composite electrode structure formed on the gate insulating layer. The composite electrode structure comprises a plurality of first electrodes formed with an inter-electrode space left between adjacent ones in the charge transfer direction on the gate Insulating layer, each of the first electrodes having opposite sidewalls, one of the sidewalls of each one of the first electrodes facing one of the sidewalls of adjacent one of the first electrodes with the Inter-electrode space therebetween, a plurality of interlayer insulating layer formed on the first electrodes to extend onto the sidewalls, and a plurality of second electrodes formed on the gate insulating layer within the inter-electrode spaces, each one of the first electrodes and adjacent one of the second electrodes being disposed to have an insulating gap determined each one of the interlayer insulating layers therebetween. A plurality of potential barrier layers are formed in the channel layer under the second electrodes, respectively, and has an impurity concentration lower than the channel layer. The sidewalls of the first electrodes are tapered to make the inter-electrode spaces diverge upwardly from the substrate surface, and each of the potential barrier layers extends into a portion of the channel layer under each of the insulating gaps.

According to this invention, there is also provided a method for producing a charge-coupled device for transferring a signal charge in a charge transfer direction. The method comprises steps of: preparing a semiconductor substrate having a substrate surface; forming a channel layer of a first conduction type in the substrate surface; forming a gate insulating layer on the channel layer, forming a plurality of first electrodes arranged in a form of strips in the charge transfer direction with inter-electrode spaces between adjacent ones of the first electrodes on the gate insulating film, each of the first electrodes having opposite sidewalls, the sidewalls being tapered to make each of the inter-electrode spaces diverge upwardly on the gate insulating layer; injecting a second conduction type impurity into the channel layer through the inter-electrode spaces using the first electrodes as a mask to form potential barrier layers having a first conduction type impurity concentration lower than the channel layer; forming insulating layers, as interlayer insulating layers, in surfaces of the first electrodes by thermal oxidation of surfaces of the first electrodes; and forming a second electrodes in the inter-electrode spaces of the first electrodes, respectively.

In the injection step, the second conduction type impurity is injected in a direction perpendicular to the substrate surface.

In an aspect, the second conduction type impurity is injected obliquely at an angle within an angular range determined by a direction perpendicular to the substrate surface and the tapered sidewalls of the first electrodes.

In another aspect, injection of the second conduction type impurity is performed at least two times, one of which is obliquely at an angle within an angular range determined by a direction perpendicular to the substrate surface and the tapered sidewalls of the first electrodes and forwardly in the charge transfer direction and, while the other being obliquely at an angle within an angular range determined by a direction perpendicular to the substrate surface and the tapered sidewalls of the first electrodes and reversely in the charge transfer direction.

In the method, injection of the second conduction type impurity may be performed with a higher injection energy during performing forwardly than during performing reversely.

In still another aspect of the method, injection of the second conduction type impurity can be performed obliquely at a larger angle inclined from the direction perpendicular to the substrate surface during performing forwardly than during performing reversely.

DESCRIPTION OF PREFERRED EMBODIMENTS

Prior to description of preferred embodiments, known CCDs and known methods producing the same will be described in connection with FIGS. 13–21 so as to support better understanding of this invention.

Referring to FIGS. 13A–13E, a known producing method of a two-phase clock type CCD with two-layer electrode structure as a known example 1 will be described wherein a semiconductor substrate, a well, and a channel layer exemplarily are an N type, a P type, and an N type in conduction type, respectively.

Figure 13A:
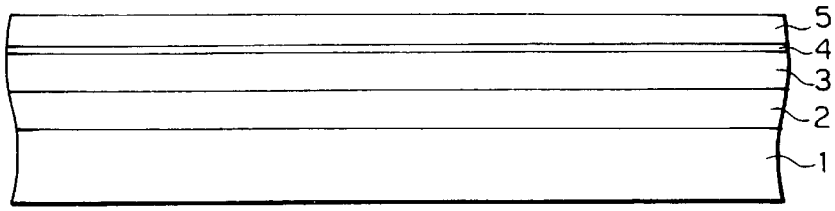
FIGS. 13A–13E are cross sectional views illustrating different steps a method of producing a CCD according to a known example 1.

In the producing method of the known example 1, referring to FIG. 13A, a P type impurity and an N type impurity are introduced or doped into an N type semiconductor substrate 1 to thereby form a P type well 2 and an N type channel layer 3, respectively, and then a gate insulating layer 4 is formed on the surface of the substrate 1. The gate insulating layer 4 is, for example, a thermally oxidized layer, or a multi-layered film of an oxide film/nitride film/oxide film (ONO film). Then, on the gate insulating film 4, a formation is made of an electrode layer 5 such as of polysilicon by the CVD technique.

Figure 13B:
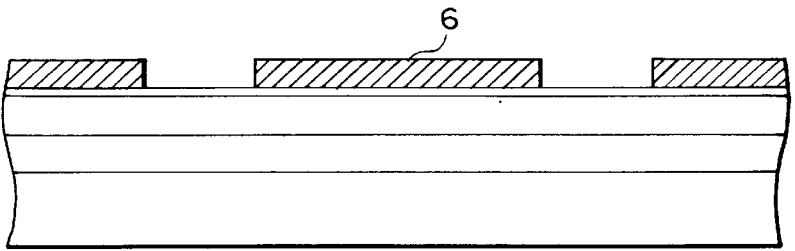

Referring to FIG. 13B, patterning and etching are performed to the first electrode layer 5 to form a plurality of first electrodes 6 with inter-electrode spaces between adjacent ones of the electrodes. Each of the first electrodes 6 has opposite sidewalls define the inter-electrode space therebetween.

Figure 13C:
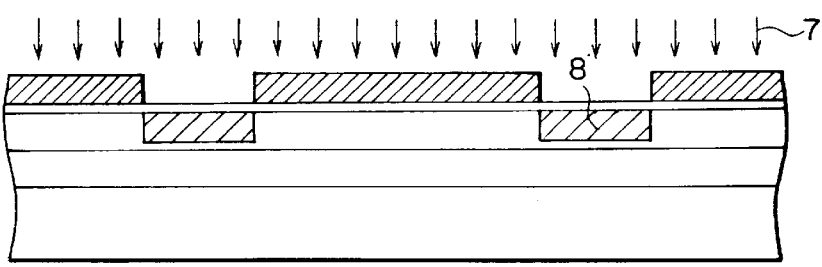

Referring to FIG. 13C, subsequently the ion injection technique of a P type impurity 7 such as boron ion is carried out into the channel layer 3 in a direction perpendicular to the substrate surface through the inter-electrode spaces in the self-matching manner by use of the first electrodes 6 as a mask to thereby form a plurality of $N^-$ type potential barrier layers 8 in the N type channel layer 3 under the inter-electrode spaces of the first electrodes 6.

Figure 13D:
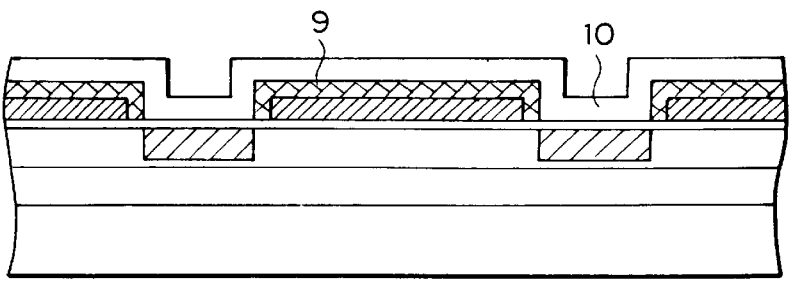

Referring to FIG. 13D, the outer surfaces and sidewalls of the first electrodes 6 are subjected to the thermal oxidization to thereby form interlayer insulating films 9 in the surfaces of the first electrodes 6, and then a second electrode layer 10 such as of polysilicon is formed on the gate insulating film 4 and the interlayer insulating film 9 by the CVD technique.

Figure 13E:
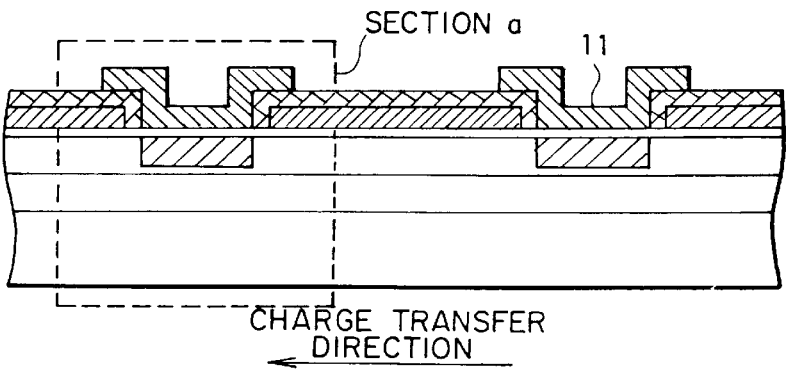

Referring to FIG. 13E, patterning and etching are performed to the second electrode layer 10 to thereby form a plurality of second electrodes 11 so as to cover the interelectrode spaces between the first electrodes 6. Thus, the two-phase clock type CCD with two layered electrode structure is obtained.

In the known method described above, the first electrodes 6 are thermally oxidized to form the inter-layer insulating layers 9 after injection of the P type impurity in the direction perpendicular to the substrate surface. Simultaneously, the sidewalls of the first electrodes 6 are retracted by the thermal oxidation and the length of each of the first electrode 6 is decreased.

Figure 14:
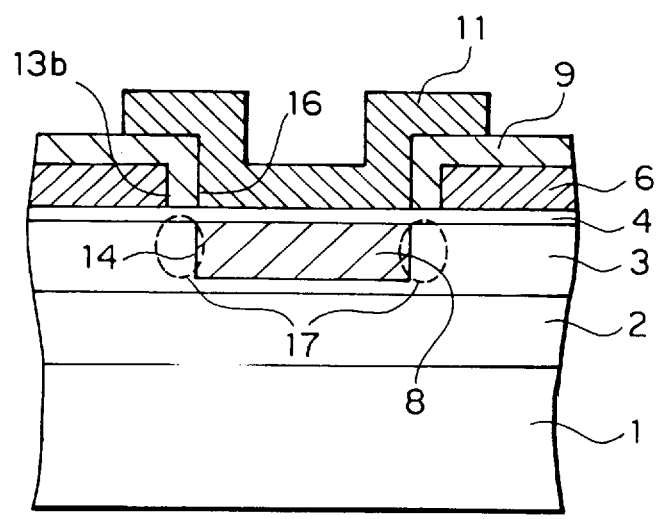
FIG. 14 is a magnified view of a section a in FIG. 13E.

Referring to FIG. 14 illustrating an enlarged view of a section a in FIG. 13E, when the gate insulating layer 4 is formed of the ONO film as a usual film, the positions of the sidewalls 13b of the first electrodes 6 after the thermal oxidation are retracted by an amount substantially equal to the thickness of the interlayer insulating film 9 formed by the thermal oxidation. As a result, the positions of the opposite end faces 14 of the N$^-$ type potential barrier layer 8 substantially coincide with the positions of sidewalls 16 of the second electrode 11, and the N$^-$ type potential barrier layers 8 is not formed in channel regions 17 (shown at dotted line circles) under the insulating gaps between the first electrode 6 and the second electrode 11.

In order to form the N$^-$ type potential barrier layer 8 extending into the channel regions 17 under the insulating gaps between the first electrode 6 and the second electrode 11, JP-A-7 29168 discloses a method wherein ion injection of the P type impurity 7 is obliquely performed forwardly and reversely or rearwardly in the charge transfer direction.

Referring to FIGS. 15A–15D, description will be made of, as a known example 2, the producing method of a CCD disclosed in JP-A-7 29168.

The method of the known example 2 is identical with that of the known example 1 in the steps until the formation step of the first electrode 6 shown in FIGS. 13A and 13B but different therefrom in the subsequent formation of the N$^-$ type potential barrier layer 8. In the known example 2, the P type impurity 7 is injected obliquely and forwardly in the charge transfer direction, that is, from the left side in FIG. 15A, and then reversely in the charge transfer direction, that is, from the right side in FIG. 15B. Accordingly, the area of the N$^-$ type potential barrier layer 8 is enlarged in the charge transfer direction and extends into the channel portion under the sidewalls 13a of the first electrode 6.

Figure 15A:
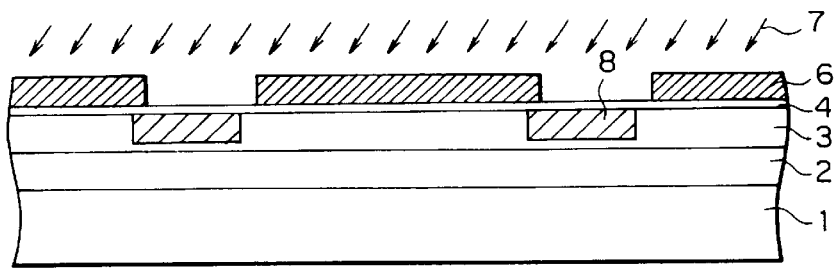
FIGS. 15A–15D are cross section views illustrating different steps a method of producing a CCD according to a known example 2.
Figure 15B:
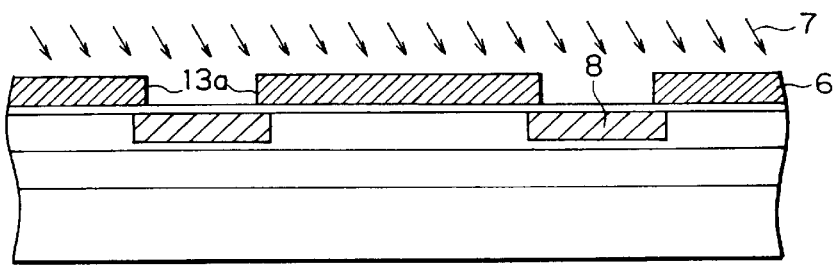
Figure 15C:
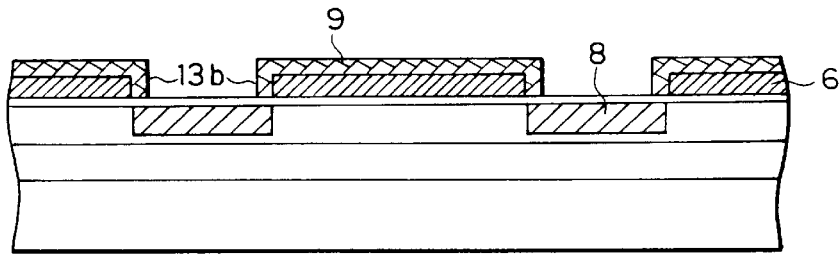
Figure 15D:
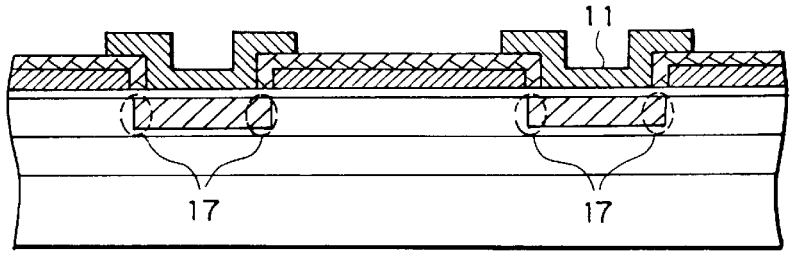

Referring to FIG. 15C, when the thermal oxidation is performed, the positions of the sidewalls 13a of the first electrodes 6 are retracted but to the positions of the sidewalls 13b of the first electrodes 6. Therefore, after the formation of the second electrodes 11, it is insured that the N$^-$ type potential barrier layer 8 is formed in the channel portions 17 under the insulating gaps between the first electrode 6 and the second electrode 11, as shown in FIG. 15D.

Figure 16A:
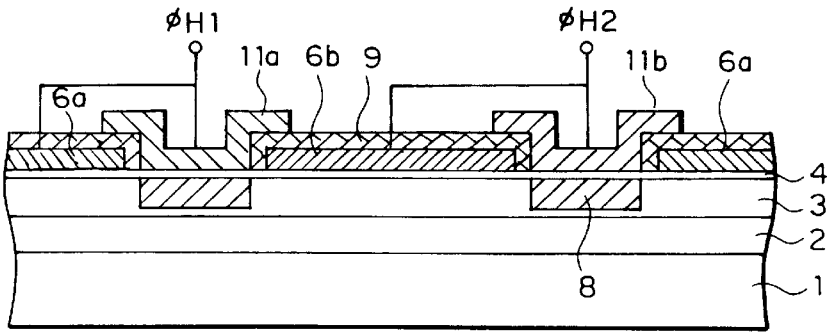
FIG. 16 is a diagram view illustrating different channel potential distribution for description of the manner in which a signal charge is transferred.
Figure 16B:
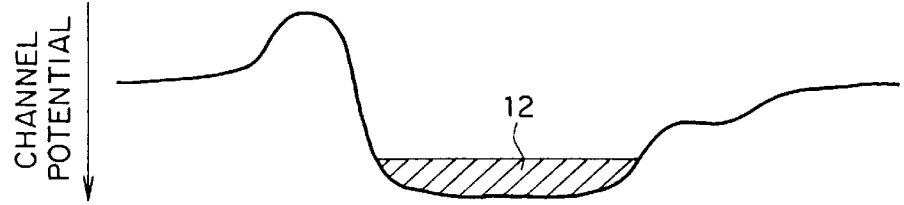
Figure 16C:
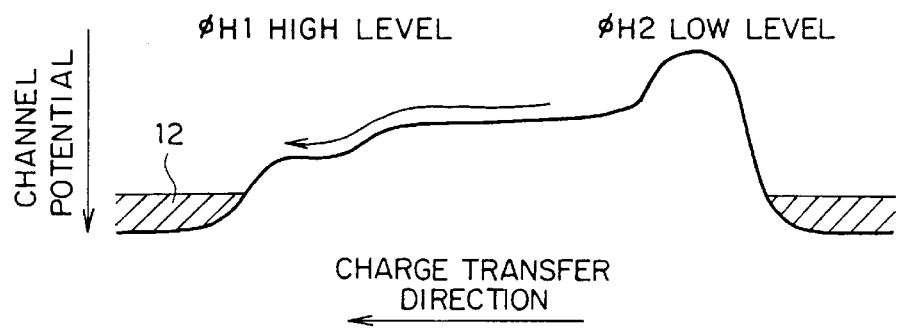

Referring to FIGS. 16A–16C, description will be made as regards the signal charge transfer by use of the model diagrams of channel potential distribution over one stage of the CCD shown therein.

When a low-level voltage is applied to a pair of first electrode 6a and second electrode 11a adjacent to each other as a first transfer electrode pair of φ H1 and a high-level voltage is simultaneously applied to another first electrode 6b and second electrode 11b adjacent to each other as a second transfer electrode pair of φ H2 adjacent to the first transfer electrode pair, a signal charge 12 is accumulated in the channel under the first electrode 6b of the second transfer electrode pair. When the high-level and low-level voltages are switched from the existing state to an interchanged state where the high-level voltage is applied to the first transfer electrode pair of 6a and 11a of φ H1 with the low-level voltage being applied to the second transfer electrode pair of 6b and 11b of φ H2, the areas of deep potential within the channel layer change places and the signal charge 12 is consequently transferred by a 1/2 stage. By subsequently repeating the interchange of the high-level and low-level voltages of φ H1 and φ H2 in the same manner as described above, the signal charge 12 is successively transferred from one to next stage.

Those known two-phase clock type CCDs with two-layered electrode structure, however, have the problem that the potential dips or pockets often occur in the channel layer under the insulating gaps between the first electrode and the second electrode, especially when the signal charge transfer is performed by use of a low drive voltage of 3 V or less. As a result, the efficiency of transfer is degraded, as described In the preamble of the description.

Figure 17A:
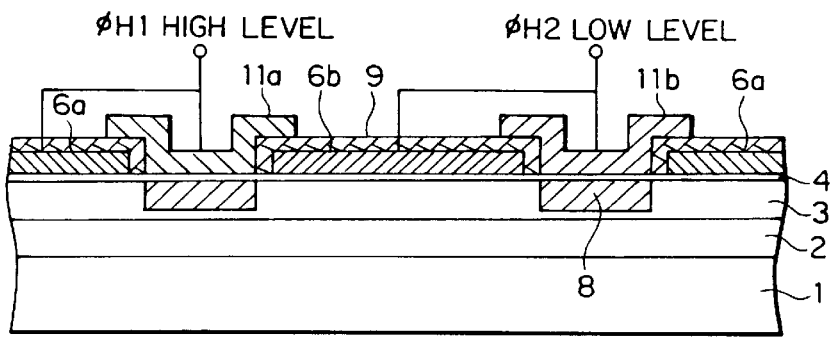
FIG. 17 is a diagram view for description of a problem when the drive clock voltage of a CCD of the known example 1 is decreased In the CCD of the known example 1.
Figure 17B:
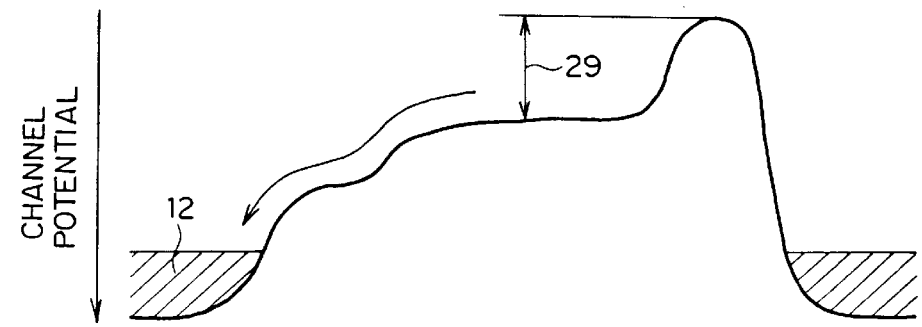
Figure 17C:
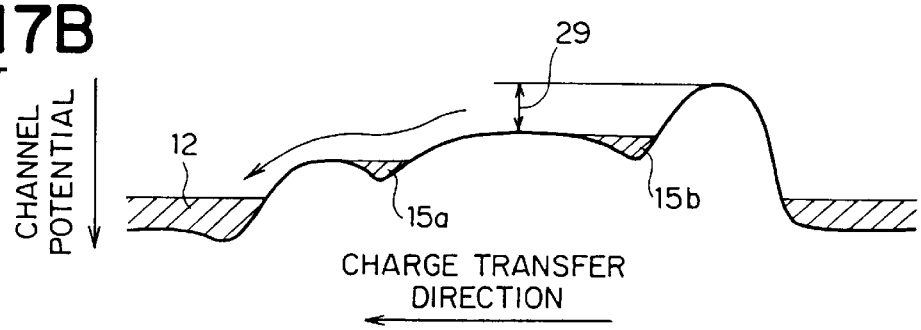

The reason for this problem will be described in detail below with reference to FIGS. 17A–17C representing a cross section of one stage portion of the CCD of the known example 1 taken along the charge transfer direction thereof CCD (FIG. 17A), a diagram view of a channel potential distribution in the cross section at a high drive voltage above 3 V (FIG. 17B), and a diagram view of the channel potential distribution in the cross section at a low drive voltage below 3 V (FIG. 17C)

The potential dip is caused by the insulating gap in the transfer electrode pair and tends to be suppressed dependent on increase of a difference in potential difference between the adjacent transfer electrode pairs. Specifically, when the drive clock voltage of CCD is fully high and a potential barrier height 29 is fully large as illustrated in FIG. 17B, the potential dip is not generated and the signal charge 12 is smoothly transferred.

On the contrary, the potential dip tends to easily occur and the charge transfer tends to degrade when the channel potential difference between the adjacent transfer electrode pairs decreases. Specifically, when the drive voltage of CCD is low and the potential barrier height 29 is small as illustrated in FIG. 17C, the channel potential difference is decreased between the second electrode 11a of one transfer electrode pair and the first electrode 6b of the adjacent transfer electrode pair and also between the first and second electrode 6b and 11b in the adjacent transfer electrode pair. As a result, a potential dip 15a generates in the channel layer under the insulating gap between the second electrode 11a and the first electrode 6b and another potential dip 15b also generates in the channel layer under the insulating gap between the first electrode 6b and the second electrode 11b. When the potential dip generates, the signal charge is trapped in the potential dip and the transfer of the signal charge is also governed by thermal diffusion because of drop of the transferring electric field in the proximity of the potential dip. As a result, the charge transfer time is greatly elongated to make a high speed charge transfer difficult and the erroneous charge transfer is caused. This means that it is important to form the CCD with the suppressed occurrence of a potential dip in order to enable to realize the high speed charge transfer with a high charge transfer efficiency even by the lowered drive clock voltage.

Figure 18:
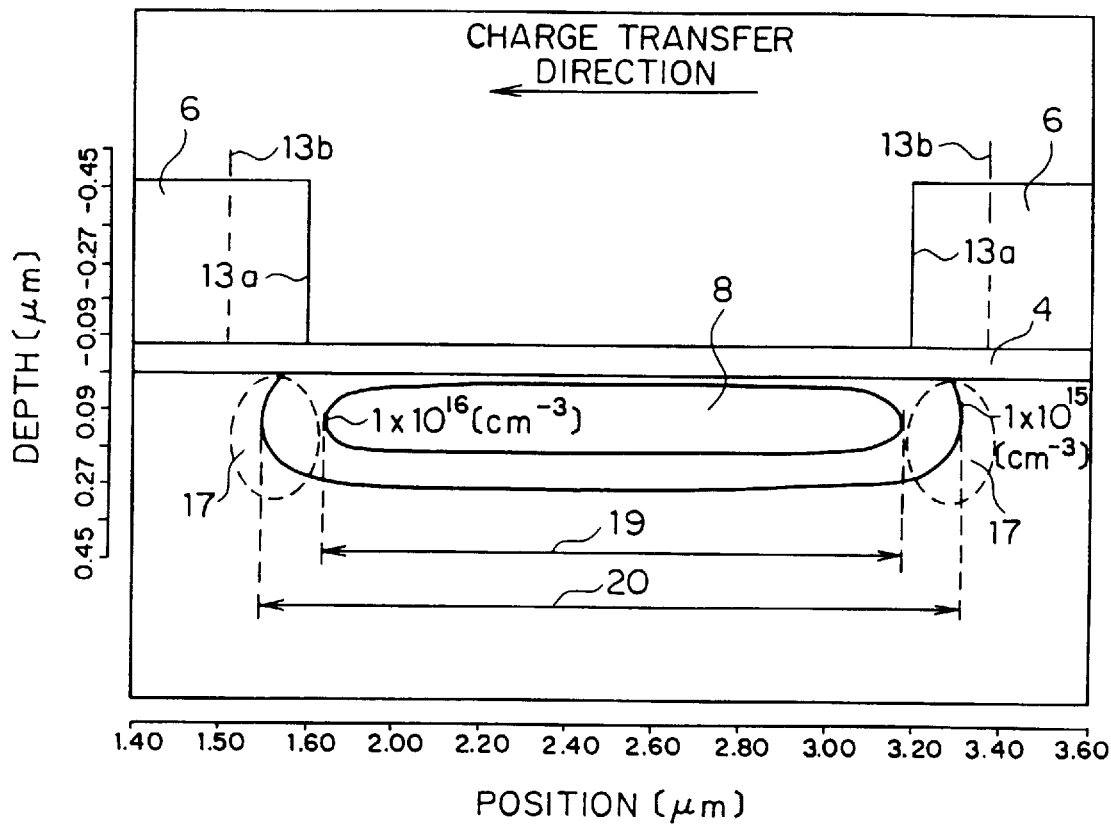
FIG. 18 is a view illustrating a P type impurity concentration distribution in the proximity of an $N^-$ type potential barrier layer by simulation of the CCD of the known example 1.

Referring to FIG. 18, description will be made as regards a P type impurity concentration distribution in the proximity of the N⁻ type potential barrier layer 8 after the injection of the P type impurity in the CCD of the known example 1. The gate insulating film 4 is formed of the ONO film which is usually used in the CCD. The inter-electrode spaces between the first electrodes 6 adjacent to one another are 1.4 μm in the charge transfer direction. As the P type impurity, boron is injected in an amount of $4.1 \times 10^{11} \mathrm{cm}^{-2}$. A region having a boron concentration of $1.0 \times 10^{16} \mathrm{cm}^{-3}$ has a width 19 of 1.33 μm in the charge transfer direction and another region having a boron concentration of $1.0 \times 10^{16} \mathrm{cm}^{-3}$ has a width 20 of 1.62 μm in the same direction.

In a typical CCD, the interlayer insulating film between the first electrode 6 and the second electrode 11 adjacent each other usually has a thickness of about 0.2 μm. Therefore, it will be understood that the positions of the opposite sidewalls 13a of the adjacent first electrodes 6 are retracted each by a distance of about 0.2 μm by the thermal oxidation and shift to positions shown at 13b in FIG. 18. Therefore, boron of low concentration only contains in the channel portions 17 under the insulating gaps between the adjacent first electrodes 6 and the second electrode 11 in the CCD after the formation of the second electrode 11 in the inter-electrode space.

Figure 19:
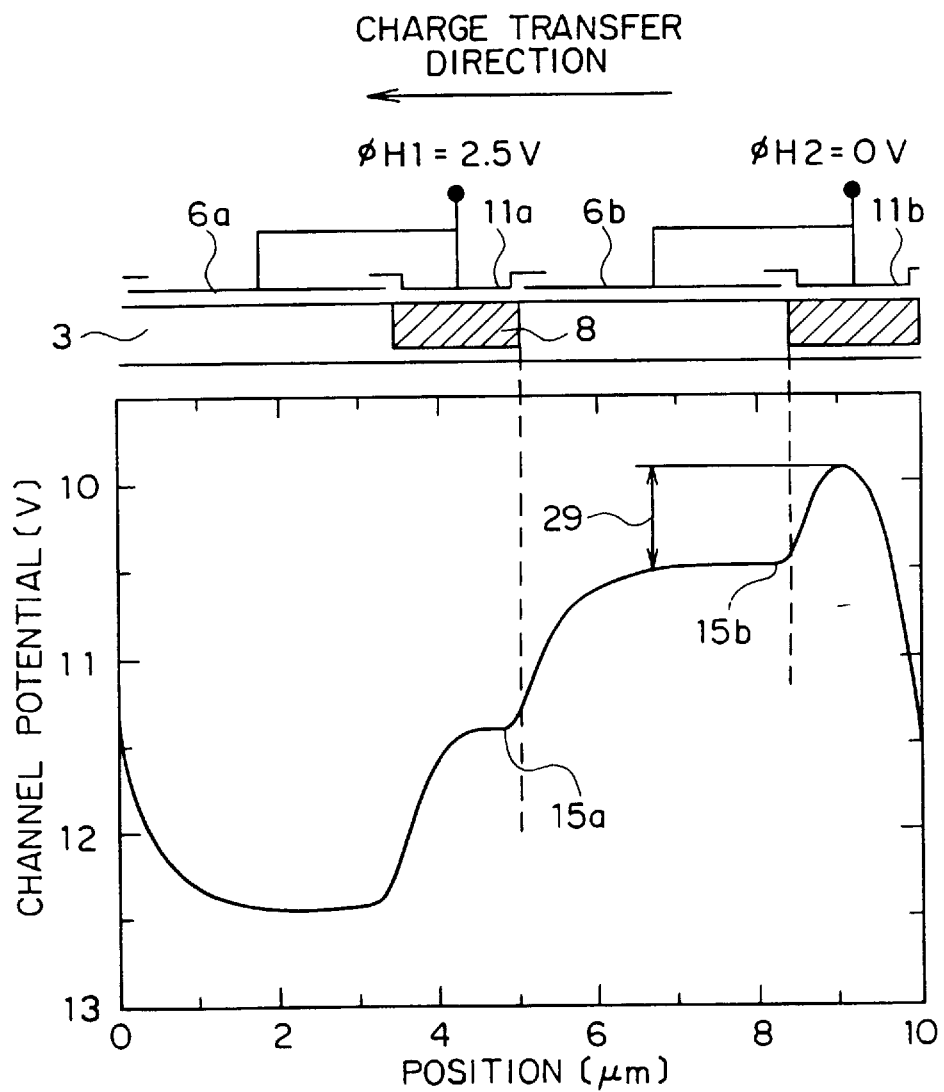
FIG. 19 is a channel potential distribution corresponding to one charge transfer stage by simulation of the CCD of the known example 1.

Referring to FIG. 19, a channel potential distribution of the CCD of known example 1 is illustrated which is obtained by a simulation where the voltages applied to the transfer electrode pairs are φ H1=2.5 V and φ H2=0 V, the length of one stage is 10 μm, and the potential barrier height 29 formed in the channel during perfect depletion is 0.8 V. Since a small amount boron is only injected Into the channel portions 17 under the insulating gaps between the first electrodes 6a and 6b and the second electrode 11a as described in connection with FIG. 18, a potential dip 15a of 0.004 eV is generated in the channel portion under the insulating gap between the second electrode 11a of one transfer electrode pair φ H1 and the first electrode 6b of the adjacent transfer electrode pair φ H2 but at a forward side (leftward side in the figure) from the insulating gap position between the both electrodes in the charge transfer direction. On the other hand, in the channel portion under another insulating gap between the first electrode 6b and the second electrode 11b of the other transfer electrode pair φ H2, another potential dip 15b of 0.014 eV is generated at a forward side from the position of the insulating gap between the both electrodes in the charge transfer direction. The CCD of the known example 1, therefore, has the problem of difficulty in transferring the signal charge at a high speed with a low drive voltage.

Figure 20:
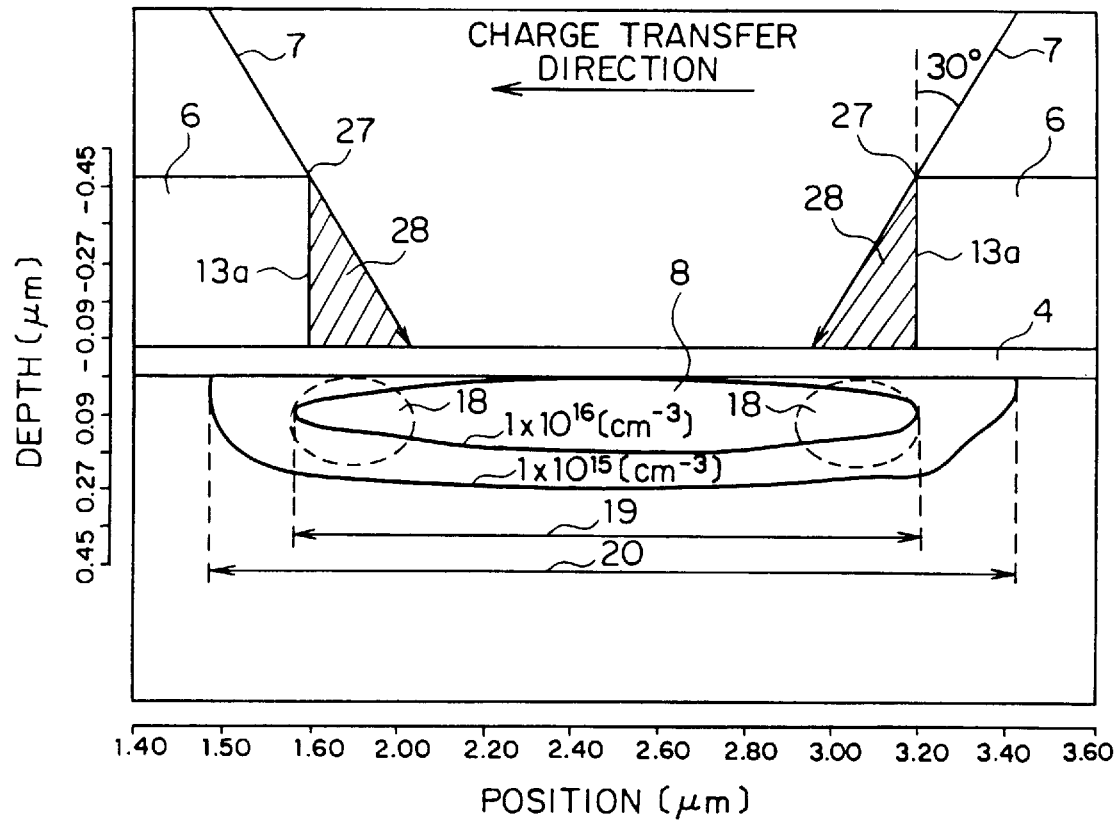
FIG. 20 is a view illustrating a P type impurity concentration distribution in the proximity of an $N^-$ type potential barrier layer by simulation of the CCD of the known example 2.

Referring to FIG. 20, description will be made as regards a P type impurity concentration distribution in the proximity of the N⁻ type potential barrier layer 8 after the injection of the P type impurity in the CCD of the known example 2. The gate insulating film 4 is formed of the ONO film which is usually used in the CCD. The inter-electrode spaces between the first electrodes 6 adjacent to one another are 1.4 μm in the charge transfer direction. Ion injection of boron as the P type impurity is performed two times each by an amount of $3.0 \times 10^{11} \mathrm{cm}^{-2}$ in different oblique directions, one of which is an oblique direction inclined by an angle of 30° from the direction perpendicular to the substrate but forwardly in the charge transfer direction, the other one being another oblique direction inclined by an angle of 30° from the direction perpendicular to the substrate reversely in the charge transfer direction. Due to the oblique ion injection, the boron injected area is increased in the charge transfer direction as compared with that In the perpendicular ion injection in the known example 1. A region having a boron concentration of $1.0 \times 10^{16} \mathrm{cm}^{-3}$ has a width 19 of 1.45 μm in the charge transfer direction and another region having a boron concentration of $1.0 \times 10^{15} \mathrm{cm}^{-3}$ has a width 20 of 1.85 μm in the same direction.

However, edge portions formed by the upper faces and the sidewalls of each of the first electrodes 6 interfere the two times oblique injection, respectively. Therefore, shaded areas 28 are formed as shown at hatched regions, against the two times oblique ion injection. As a result, the boron concentration is low in each of the channel portions 18 (shown at dotted line circles) under the shaded areas as compared with the structure in the known example 1.

Figure 21:
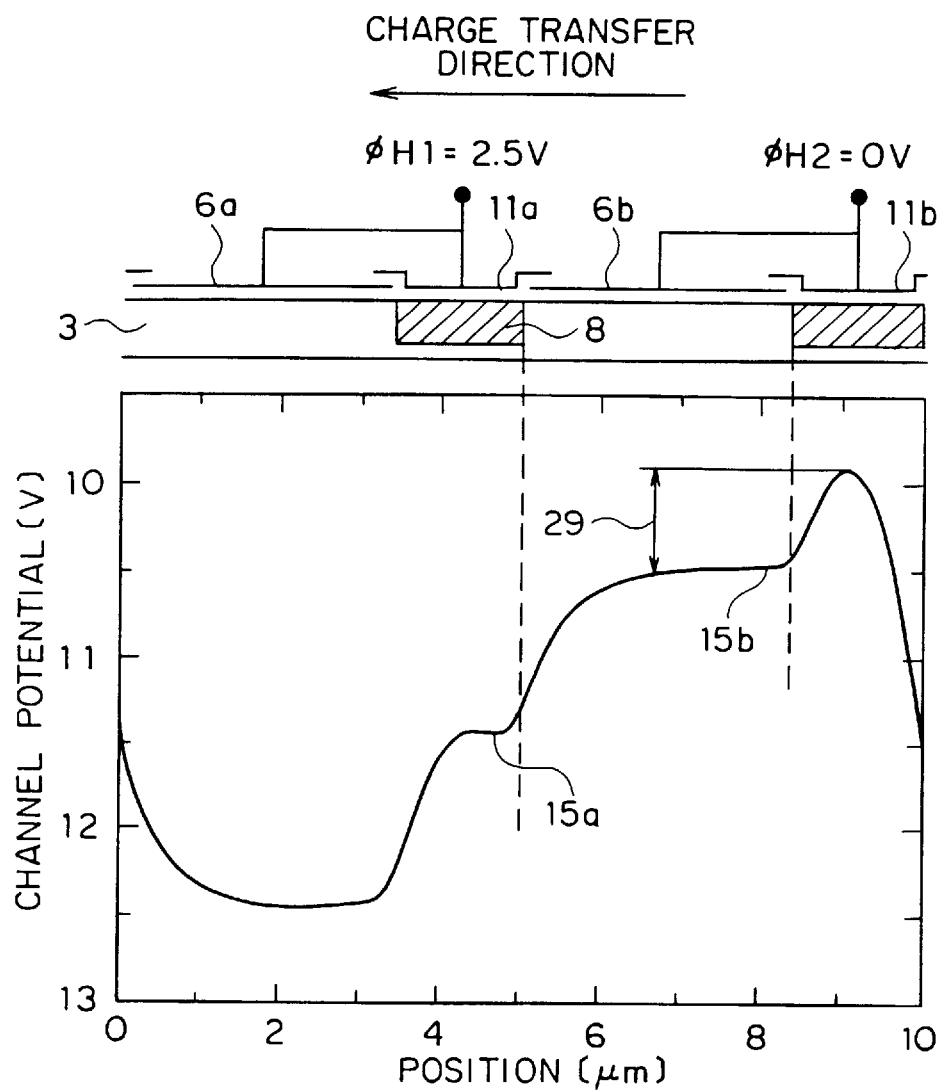
FIG. 21 is a channel potential distribution corresponding to one charge transfer stage by simulation of the CCD of the known example 2.

Referring to FIG. 21, a channel potential distribution of the CCD of known example 2 is illustrated which is obtained by a simulation where the voltages applied to the transfer electrode pairs are φ H1=2.5 V and φ H2=0 V, the length of one stage is 10 μm, and the potential barrier height 29 formed in the channel during perfect depletion is 0.8 V, similar to that in the known example 1. A potential dip 15a of 0.017 ev is generated in the channel portion under the insulating gap between the second electrode 11a of one transfer electrode pair φ H1 and the first electrode 6b of the adjacent transfer electrode pair φ H2 but at a forward side (leftward side in the figure) from the insulating gap position between the both electrodes in the charge transfer direction. On the other hand, in the channel portion under another insulating gap between the first electrode 6b and the second electrode 11b of the other transfer electrode pair φ H2, another potential dip 15b of 0.007 eV is generated at a forward side from the position of the insulating gap between the both electrodes in the charge transfer direction. It should be noted that the known example 2 cannot effectively suppress generation of the potential dips, and cannot, therefore, yet resolve the problem of difficulty in transferring the signal charge at a high speed with a low drive voltage.

Now, preferred embodiments will be described below.

Referring to FIGS. 1A–1E, description will be made as regards a method of producing a CCD according to a first embodiment of this invention.

Figure 1A:
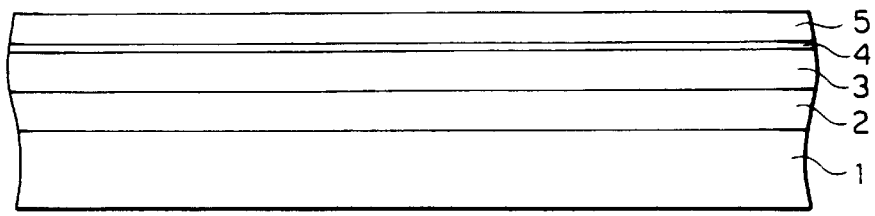
FIGS. 1A–1E are cross sectional views illustrating different steps a method of producing a CCD according to the first embodiment of this invention.

Referring to FIG. 1A, an N type semiconductor substrate 1 having a substrate surface is prepared and is formed with a P type well 2 and an N type channel layer 3 formed therein by introducing a P type impurity such as boron and an N type impurity such as phosphorus into the N type semiconductor substrate 1. Then, a gate insulating film 4 is formed on the substrate surface which is of, for example, a thermal oxide film or a three-layer structure film of ONO film. On the gate insulating film 4, a first electrode layer 5 is made of polysilicon by the CVD technique.

Figure 1B:
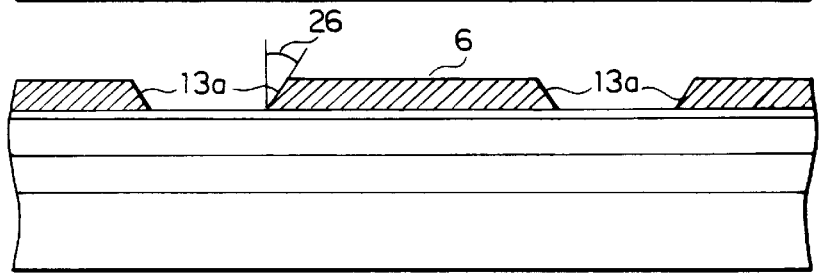

Referring to FIG. 1B, the electrode layer 5 is patterned and etched to form a plurality of first electrodes 6. Each of the first electrodes 6 has an opposite sidewalls at opposite ends in a direction which is corresponding to the charge transfer direction into a finished CCD. Between each two of first electrodes 6 adjacent to each other, a space is left as an inter-electrode space defined by sidewalls of adjacent ones of the first electrodes 6. The etching is carried out by use of both of an isotropic etching gas and an anisotropic etching gas, so that the opposite sidewalls of each one of the first electrodes 6 are formed in a tapered form which is inclined by an angle 26 from the direction perpendicular to the substrate surface. Thus, each of the Inter-electrode spaces has a shape which diverges upwardly from the gate insulating layer 4. The angle 26 of the tapered sidewall is preferred to be within an angular range of about 10 angular degrees to 45 angular degrees (about 10°–45°) in order to thereby insure extension of a width of the N⁻ type potential barrier layers in the charge transfer direction.

Figure 1C:
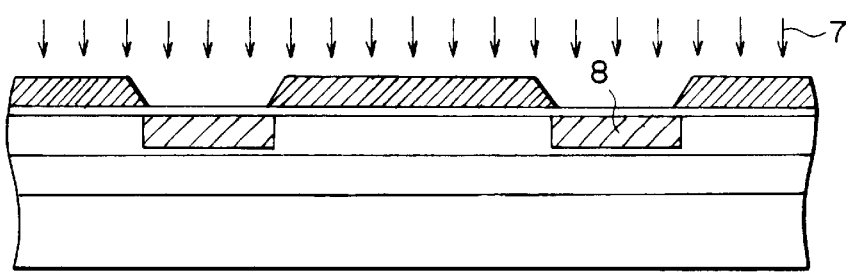

Referring to FIG. 1C, subsequently, a plurality of N⁻ type potential barrier layers 8 are formed in the N type channel layer 3 under the inter-electrode spaces by introducing the P type impurity 7 such as boron by the ion injection technique in the direction perpendicular to the substrate through the inter-electrode spaces in the self-matching manner by use of the first electrodes 6 as a mask.

During the injection of the P type impurity, the tapered sidewall of the first electrode 6 allows the P type impurity to penetrate the sidewall portion into the channel layer to thereby insure extension of a width of the N⁻ type potential barrier layers in the charge transfer direction. If the angle 26 is smaller than about 10°, the P type impurity 7 can hardly penetrate the sidewall portion of the first electrode. As a result, the extended N⁻ type potential barrier layer is insured to be formed.

Figure 1D:
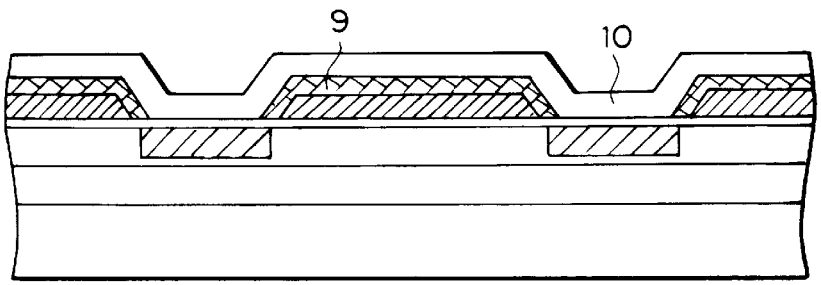

Referring to FIG. 1D, a plurality of interlayer insulating films 9 are then formed by thermally oxidizing outer surfaces including sidewalls of the first electrodes 6.

If the angle 26 of tapered sidewall 13a of the first electrode 6 is larger than about 45°, the tapered sidewall portion is wholly oxidized thermally, so that the interlayer insulating gap between the first electrode 6 and a second electrode 11 is inevitably enlarged.

Subsequently, an electrode layer 10 of polysilicon is formed on the gate insulating film 4 in the inter-electrode spaces and on the interlayer insulating films 9 by the CVD technique.

Figure 1E:
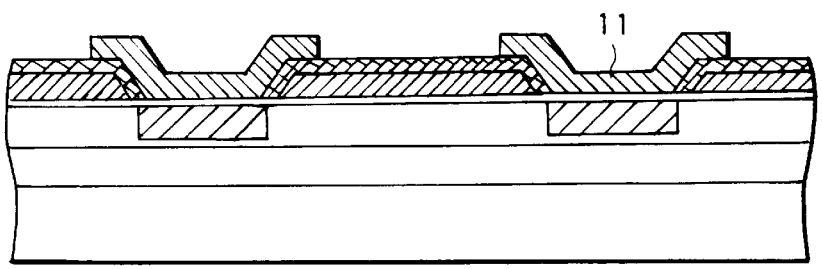

Finally, referring to FIG. 1E, the electrode layer 10 is patterned and etched to form a plurality of second electrodes 11 which are in the inter-electrode spaces and partially extend onto the interlayer insulating substrate 9.

According to the process including the steps mentioned above, the two-phase clock type CCD with a composite electrode structure of of this invention is formed. This method can be carried out in the same number of steps as the conventional method.

Figure 2A:
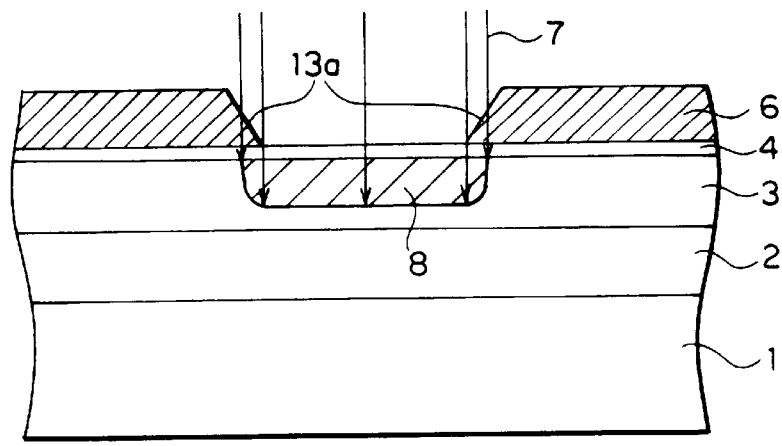
FIGS. 2A–2C are views for description of the effect of the method of the first embodiment.
Figure 2B:
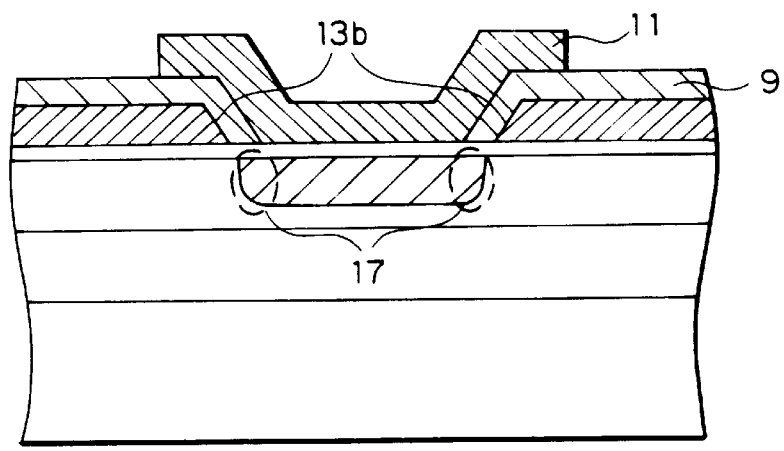
Figure 2C:
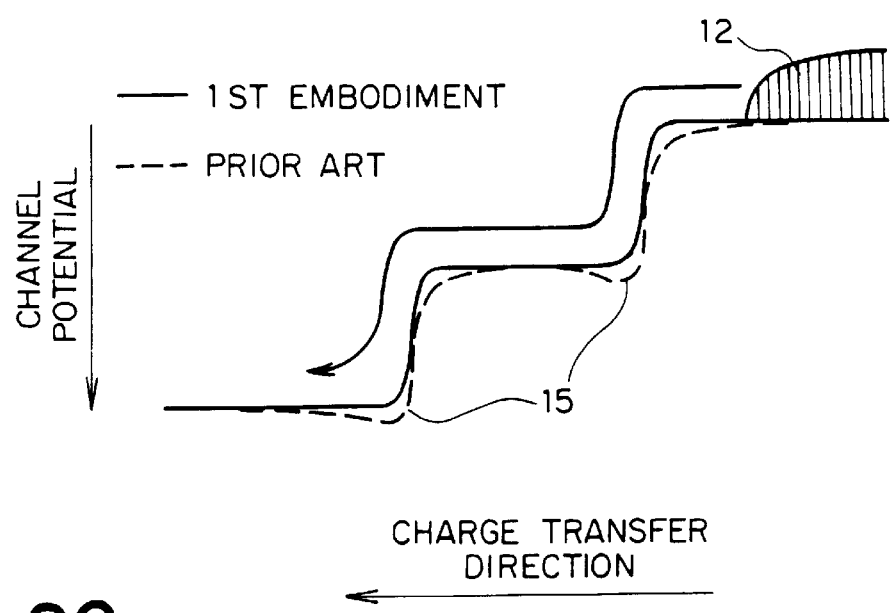

Referring to FIGS. 2A–2C representing diagramatical cross sectional views in the proximity of one of the N⁻ type potential barrier layers 8 and the channel potential distribution in the charge transfer direction, description will be made as regards the effect of the method according to the first embodiment of this invention.

Referring to FIGS. 2A and 2B, the tapered sidewalls 13a make thin portions or thickness-reduced portions of the first electrodes 6 at opposite side portions thereof. In the injection of the P type impurity 7 in the self-matching manner through the mask of the first electrodes 6, the tapered sidewalls 13a allow the P type impurity 7 to penetrate the thin portions and be consequently injected into the channel portions under the sidewall portions of the first electrodes 6. Accordingly, after formation of the interlayer insulating layers 9 and the second electrodes 11, the N⁻ type potential barrier layer 8 is formed not only in the channel portion under the second electrode 11 but also in channel portions 17 (shown at dotted line circles) under the insulating gaps between the first electrodes 6 and the second electrode 11. In FIG. 2B, the reference numeral 13b denotes the sidewalls of the first electrodes 6 after the thermal oxidation to form the interlayer insulating layers 9.

Referring to FIG. 2C, in the CCD formed by the method according to the first embodiment of this invention described above, it will be understood that generation of the potential dip 15 is effectively suppressed which has been generated in the known CCDs due to the insulating gaps between the first and second electrodes. Accordingly, the charge transfer field is fortified as compared with the known CCDs and the signal charge 12 is smoothly transferred without being entrapped by the potential dips 15. Thus, there is obtained a CCD operable at a high speed with a low voltage.

EXAMPLE 1

An example according to the first embodiment of this invention will be described below again referring to FIGS. 1A–1E.

At first, as in shown in FIG. 1A, boron was introduced into an N type semiconductor substrate 1 to form a P type well 2 having an impurity concentration of $3 \times 10^{15}$ $cm^{-3}$ with a junction at a depth of 6 μm. Then, phosphorus was introduced therein to form an N type channel layer 3 having an impurity concentration of $8 \times 10^{16} cm^{-3}$ with a junction at a depth of 1 μm. On the surface of the substrate 1, an ONO film as a gate insulating film 4 was deposited in a thickness to provide a capacity equivalent to that of an oxide film of 700 A (Angstrom) thickness. Further, on the gate insulating film 4, an electrode layer S of polysilicon was formed with a thickness of 4,000 A which had a sheet resistance of 20–30 Ω /□ reduced by injecting phosphorus.

Next, as shown in FIG. 1B, the electrode layer 5 was patterned to form therein spaces of openings each having a width of 1.4 μm in the charge transfer direction so as to form a plurality of first electrodes spaced by the openings as inter-electrode spaces, and etched with an etching gas consisting of HBr, C12 and SF6 to make opposite sidewalls defining each of the inter-electrode spaces into tapered sidewalls 13a inclined by an angle of 30° from the direction perpendicular to the substrate.

In the step shown in FIG. 1C, boron was ion-injected as a P type impurity 7 into the N type channel layer 3 under the conditions of an injection amount of $4.0 \times 10^{11} cm^{-2}$ and an injection energy of 50 KeV through a mask of the first electrodes 6 to form an N⁻ type potential barrier layers 8 under the inter-electrode spaces in the N type channel layer 3.

In the process shown in FIG. 1D, an interlayer insulating film 9 was formed in a thickness of 2,000 A by thermally oxidizing the first electrodes 6. On the gate insulating film 4 in the inter-electrode spaces and the interlayer insulating film 9, an electrode layer 10 of polysilicon was formed in a thickness of 3,000 A which had a sheet resistance of 20–30 Ω /□ reduced by injecting phosphorus.

Finally, as shown in FIG. IE, the electrode layer 10 was patterned and etched to form a plurality second electrodes 11.

Figure 3:
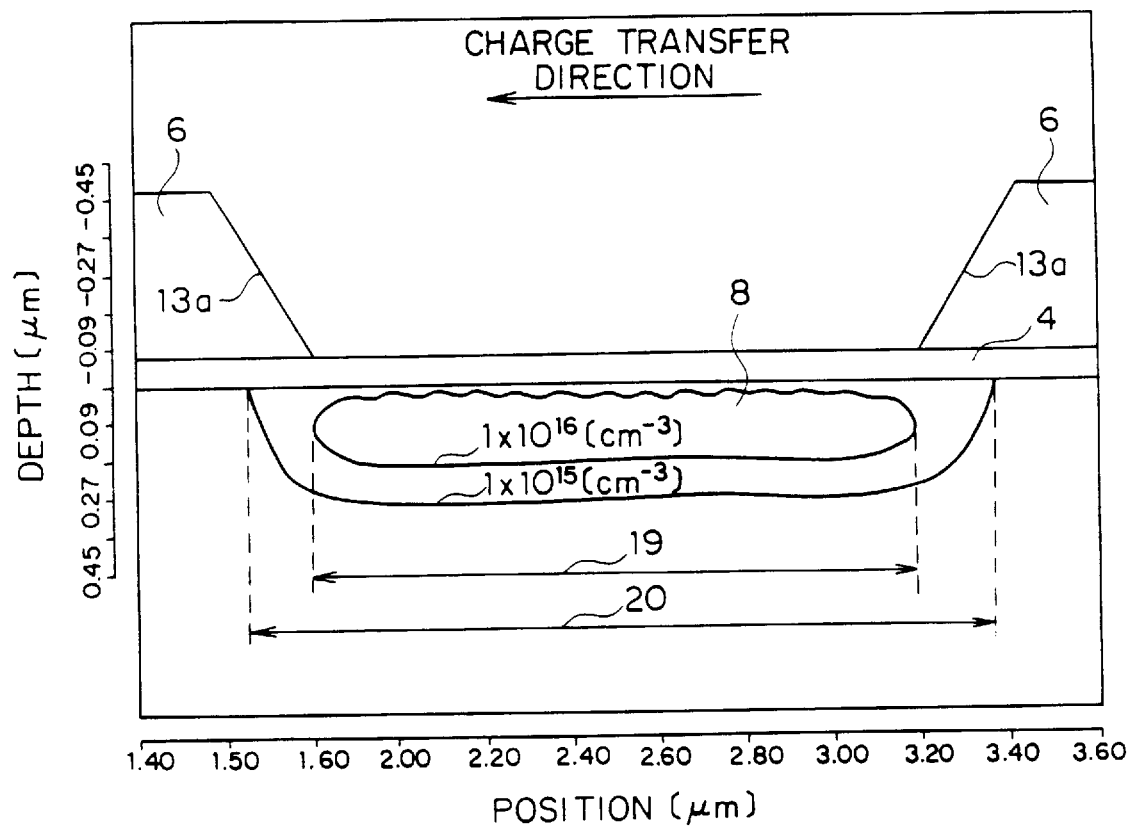
FIG. 3 is a view illustrating a P type impurity concentration distribution in the proximity of an $N^-$ type potential barrier layer by simulation of the CCD of Example 1 of this invention.

Referring to FIG. 3, description will be made as regards a P type impurity concentration distribution in the proximity of the N⁻ type potential barrier layer 8 after the injection of the P type impurity in the CCD of the Example 1 of this invention In the step of forming the N⁻ type potential barrier layer 8, boron penetrates through the thin portions of the tapered sidewalls 13a and is introduced into channel portions under the thin portions of the tapered sidewalls 13a. As a result, a region having a boron concentration of $1.0 \times 10^{16} cm^{-3}$ has a width 19 of 1.39 μm in the charge transfer direction and another region having a boron concentration of $10 \times 10^{15} cm^{-3}$ has a width 20 of 1.72 μm in the same direction. That is, the N⁻ type potential barrier layer 8 in the CCD of Example 1 has an increased width in the charge transfer direction in comparison with the CCD formed by the known example 1.

Figure 4:
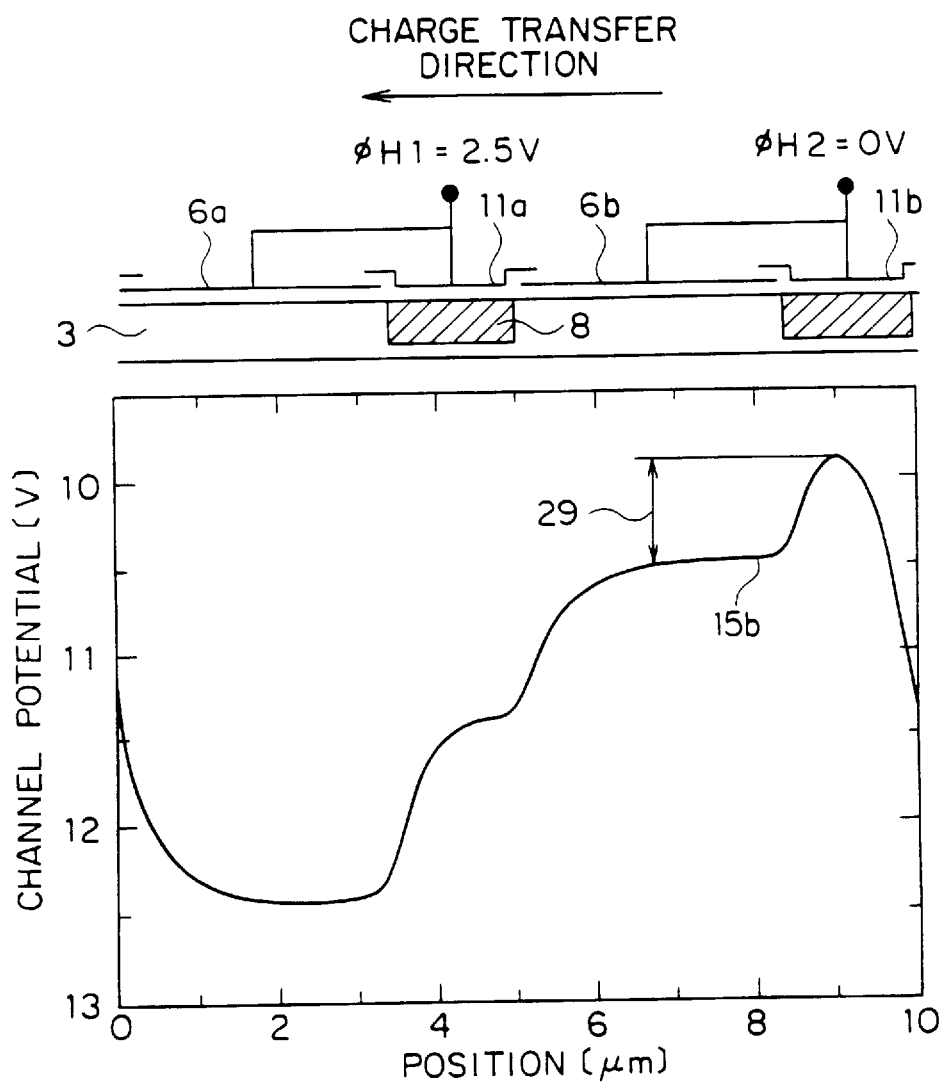
FIG. 4 is a channel potential distribution corresponding to one charge transfer stage by simulation of the CCD of Example 1.

Referring to FIG. 4, a channel potential distribution over one stage of the CCD of example 1 of this Invention is illustrated which is obtained by a simulation where the voltages applied to the transfer electrode pairs are φ H1=2.5 V and φ H2=0 V, the length of one stage is 10 μm, and the potential barrier height 29 formed in the channel during perfect depletion is 0.8 V similar to the known examples 1 and 2.

No potential dip is generated in the channel portion under the insulating gap between the second electrode 11a of one transfer electrode pair φ H1 and the first electrode 6b of the adjacent transfer electrode pair φ H2. A potential dip 15b is formed in the channel layer under the insulating gap between the first electrode 6b and the second electrode 11b of the adjacent transfer electrode pair φ H2 but is very small such as as level 0.001 eV.

It will be understood that the CCD of Example 1 of this invention can smoothly transfer the signal charge and can be driven at a high speed with a low voltage in comparison with the known CCDS.

Now, description will proceed to another producing method of CCD according to a second embodiment of this invention.

In the second embodiment, a plurality of first electrodes 6 with tapered sidewalls are formed on the semiconductor substrate 1 with the well layer 2, channel layer 3 and the gate insulator layer 4 in the similar manner as the first embodiment as described in connection with FIGS. 1A and 1B. Subsequently, the P type impurity 7 such as of boron is injected into the channel layer 3 through a mask of the first electrodes 6.

Figure 5A:
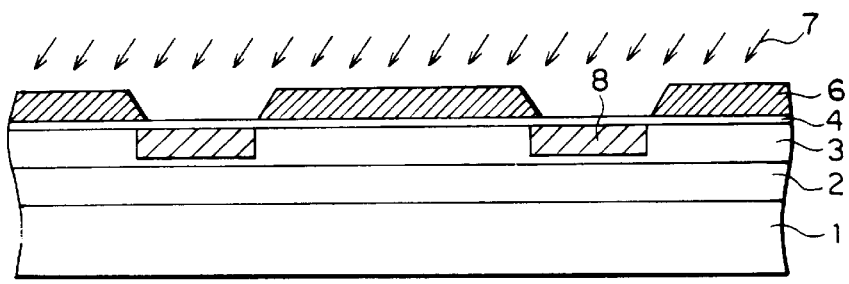
FIGS. 5A and 5B are cross sectional views illustrating different steps of another CCD producing method according to a second embodiment of this invention.
Figure 5B:
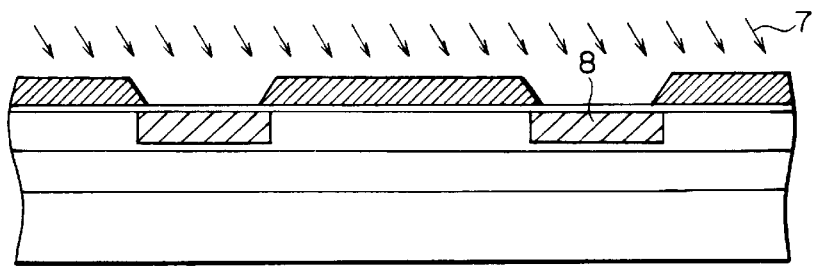

Referring to FIGS. 5A and 5B, the injection of the P type impurity 7 is performed two times in oblique directions inclined by different angles from the direction perpendicular to the substrate but within an angular range made by the opposite tapered sidewalls defining the upwardly divergent inter-electrode space. In detail, the injection is carried out obliquely and forwardly in the charge transfer direction at one time as shown in FIG. 5A, and also obliquely but reversely in the charge transfer direction at the other time as shown in FIG. 5B.

Thereafter, interlayer insulating layers 9 and a plurality of second electrodes 11 are formed in the similar manner as illustrated in FIGS. 1D and E in the first embodiment of this invention.

By the method including the steps mentioned above, there is obtained a two-phase clock type CCD according to the second embodiment of this invention. This method can be carried out in the same number of steps in the known examples 1 and 2.

Figure 6A:
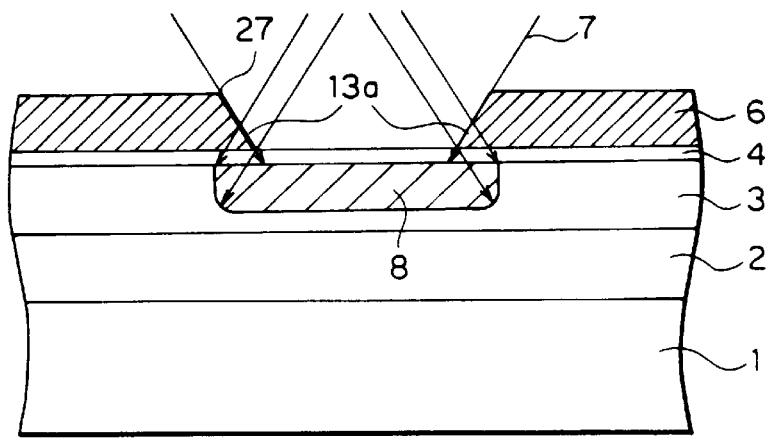
FIGS. 6A–6C are views for description of the effect of the method of the second embodiment.
Figure 6B:
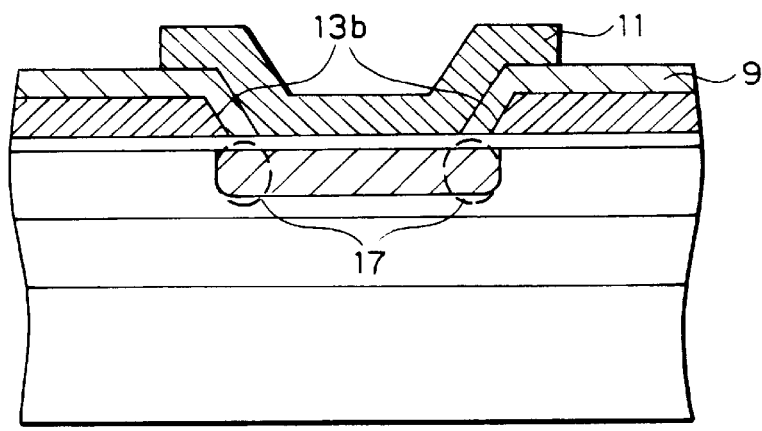
Figure 6C:
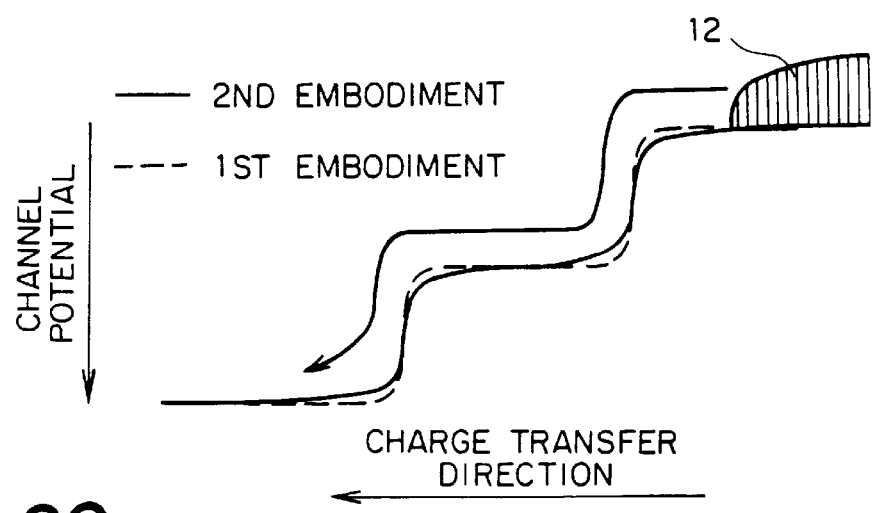

Referring to FIGS. 6A–6C representing diagramatical cross sectional views in the proximity of one of the N⁻ type potential barrier layers 8 and the channel potential distribution in the charge transfer direction, description will be made as regards the effect of the method according to the second embodiment of this invention.

Second embodiment of this invention has the following effect in addition to the effects of first embodiment described above.

Referring to FIG. 6A, the boron obliquely ion-injected is introduced in a uniform concentration in the region of the channel layer 3 under the Inter-electrode space not masked by the first electrode 6. This is because the tapered sidewall makes no edge portion of the first electrode 6 for interfering the oblique injection to form the shade. Besides, the boron obliquely injected can be introduced into not only the region under the inter-electrode space but also the regions under the tapered sidewall portions. The width of the N⁻ type potential barrier layer 8 is further enlarged in comparison with that in the first embodiment.

Accordingly, after formation of the interlayer insulating layers 9 and the second electrodes 11, the N⁻ type potential barrier layer 8 is formed not only in the channel portion under the second electrode 11 but also in a channel portions 17 under the insulating gap between the first electrode 6 and the second electrode 11, as shown in FIG. 6B.

Referring to FIG. 6C, in the CCD formed by the method according to the second embodiment of this invention described above, it will be understood that generation of the potential dip 15 is more effectively suppressed than the first embodiment.

Accordingly, the charge transfer field is fortified as compared with the first embodiment as well as the known CCDs and the signal charge 12 is smoothly transferred without being entrapped by the potential dip 15. Thus, there is obtained a CCD operable at a high speed with a low voltage.

The same effect as described above is attained by fixing the angle of injection of the P type impurity 7 at an angle within the angular range between the direction perpendicular to the substrate and the tapered sidewall before starting the injection, and performing the injection of the P type impurity while rotating the substrate around the direction perpendicular to the substrate.

EXAMPLE 2

Now, Example 2 of this invention will be described below as an example of the second embodiment.

In the similar manner as in Example 1, a semiconductor substrate 1 was prepared to have the P type well 2, the N type channel layer 3, and a plurality of first electrodes 6 with tapered sidewalls as shown in FIG. 5A.

In the P type impurity oblique injection steps as shown in FIGS. 5A and 5B, boron injection was performed under the conditions of an injection amount of $2.6 \times 10^{11} \text{cm}^{-2}$ and an injection energy of 50 KeV obliquely at an angle of 30° relative to the direction perpendicular to the substrate and forwardly at one time (in FIG. 5A) and reversely (in FIG. 5B) in the charge transfer direction.

Thereafter, an CCD was completed through the steps similar to Example 1.

Figure 7:
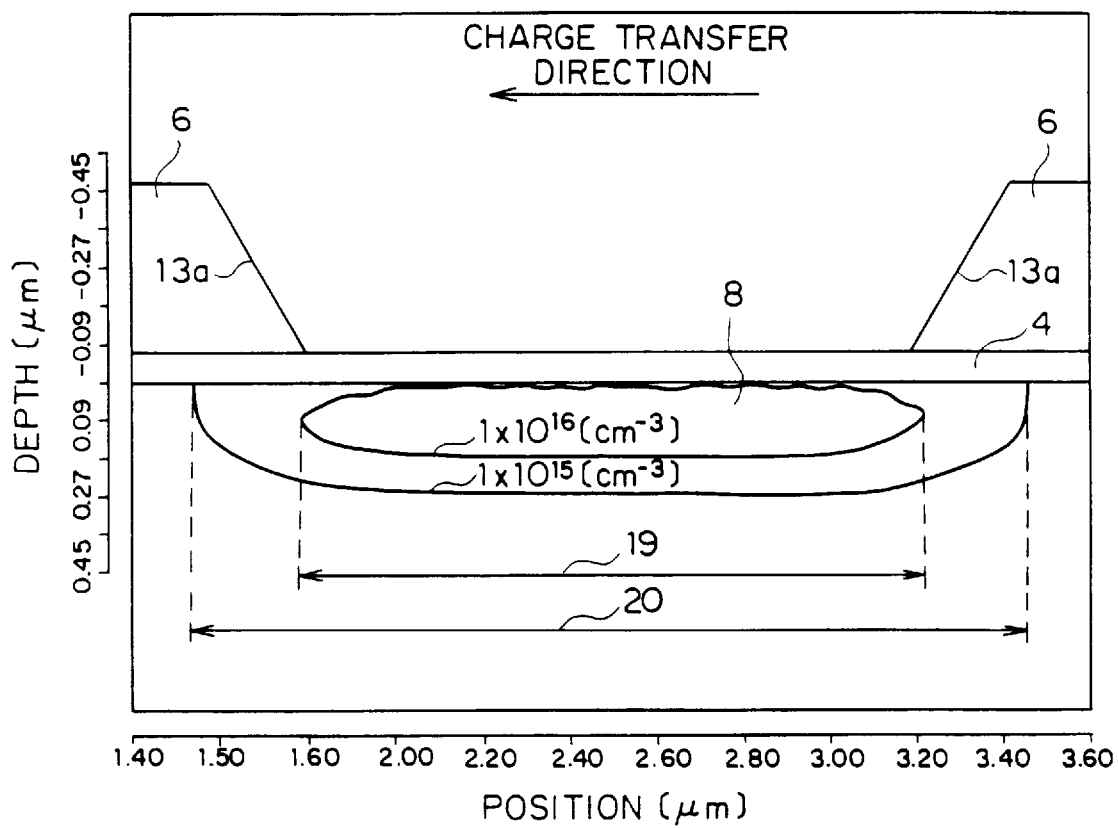
FIG. 7 is a view illustrating a P type impurity concentration distribution in the proximity of an $N^-$ type potential barrier layer by simulation of the CCD of Example 2 of this invention.

Referring to FIG. 7, description will be made as regards a P type impurity concentration distribution in the proximity of the N⁻ type potential barrier layer 8 after the injection of the P type impurity in the CCD of the Example 2 of this invention.

In the steps of forming the N⁻ type potential barrier layer 8, boron is obliquely injected forwardly and reversely in the charge transfer direction and also penetrates through the thin portions of the tapered sidewalls 13a. Therefore, boron is more effectively introduced into channel portions under the thin portions of the tapered sidewalls. As a result, a region having a boron concentration of $1.0 \times 10^{16} \text{cm}^{-3}$ has a width 19 of 1.45 μm in the charge transfer direction and another region having a boron concentration of $1.0 \times 10^{15} \text{cm}^{-3}$ has a width 20 of 1.92 μm in the same direction. That is, the N⁻ type potential barrier layer 8 in the CCD of Example 2 has an increased width in the charge transfer direction in comparison with the CCD formed by any one of the known examples and Example 1.

Figure 8:
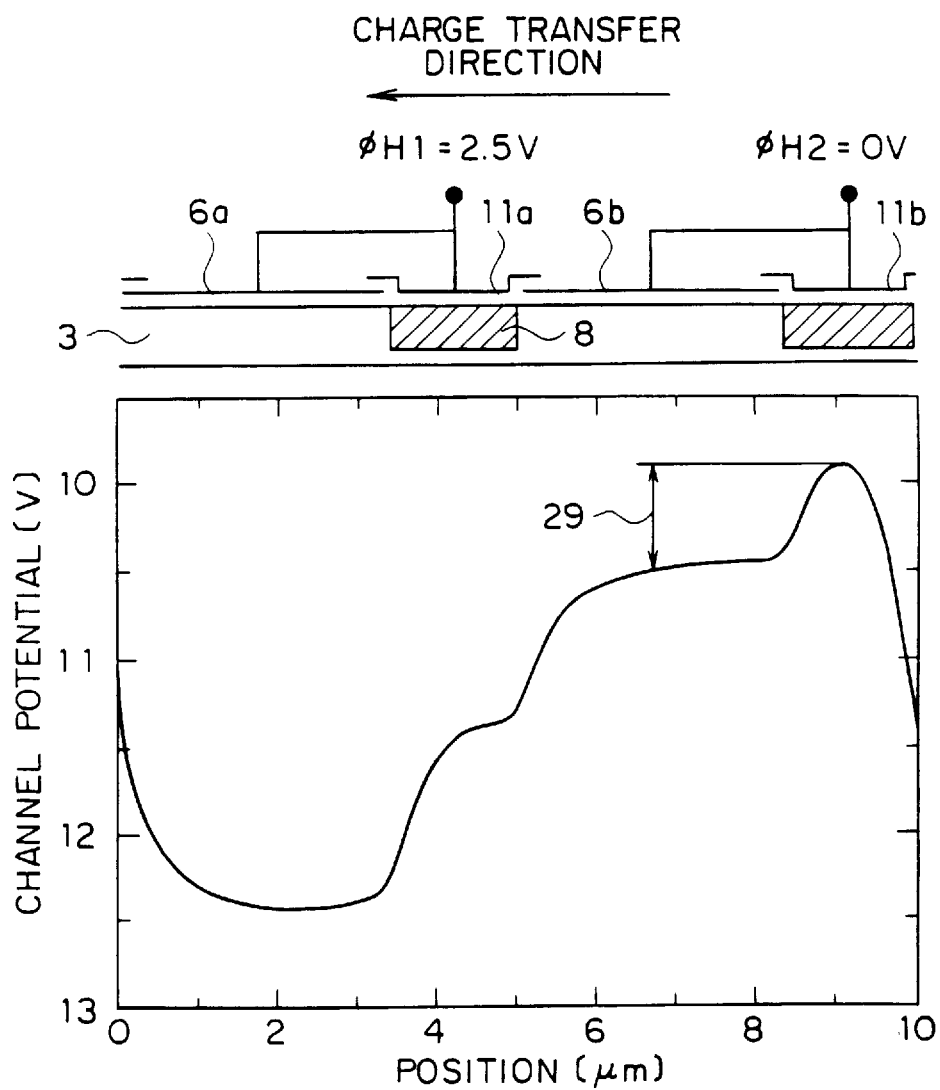
FIG. 8 is a channel potential distribution corresponding to one charge transfer stage by simulation of the CCD of Example 2.

Referring to FIG. 8, a channel potential distribution over one stage of the CCD of Example 2 of this invention is illustrated which is obtained by a simulation where the voltages applied to the transfer electrode pairs are a φ H1=2.5 V and φ H2=0 V, the length of one stage is 10 μm, and the potential barrier height 29 formed in the channel during perfect depletion is 0.8 V similar to the known examples 1 and 2.

No potential dip is generated in the channel portions under the insulating gaps between the second electrode 11*a* of one transfer electrode pair φ H1 and the first electrode 6*b* of the adjacent transfer electrode pair φ H2 and between the first electrode 6*b* and the second electrode 11*b* of the adjacent transfer electrode pair φ H2. This is because the N⁻ type potential barrier layer 8 has an increased width in the charge transfer direction and because the boron concentration in the barrier region under the inter-electrode space is kept uniform. A transfer time of 431 psec was observed for transferring an electron through 1/2 stage by the transfer electric field generated.

It will be understood that the CCD of Example 2 of this invention can smoothly transfer the signal charge and can be driven at a high speed with a low voltage in comparison with the Example 1.

Now, description will proceed to another producing method of CCD according to a third embodiment of this invention.

The third embodiment is similar to the second embodiment. The difference between the second and the third embodiment is a difference of the energy for ion-injecting P-type impurity to form the N⁻ type potential barrier layers 8.

Figure 9A:
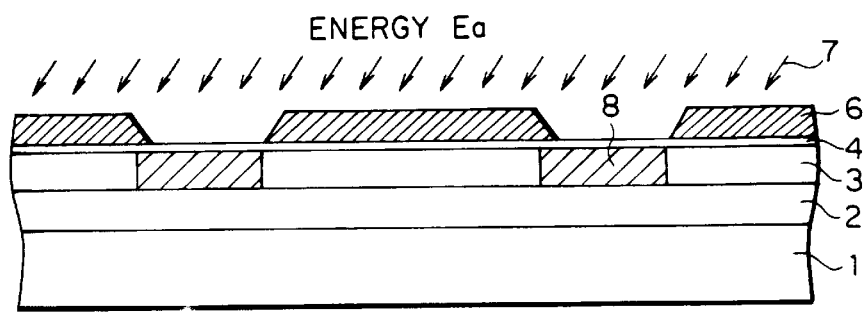
FIGS. 9A and 9B are cross section views illustrating different steps of another CCD producing method according to a third embodiment of this invention.
Figure 9B:
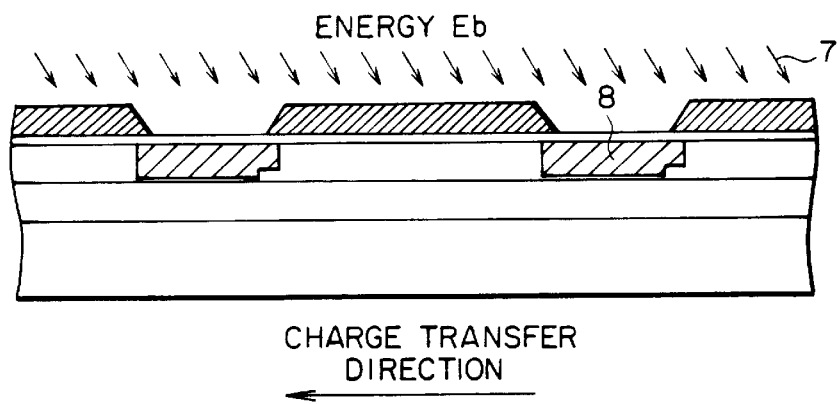

Referring to FIGS. 9A and 9B, the P type impurity 7 such as of boron is obliquely injected forwardly in the charge transfer direction under an injection energy Ea, and then obliquely injected reversely In the charge transfer direction under an injection energy Eb which is lower than the energy Ea.

It will be understood that the producing method of the third embodiment can be carried out in the same number of steps as the second embodiment as well as known methods.

Figure 10A:
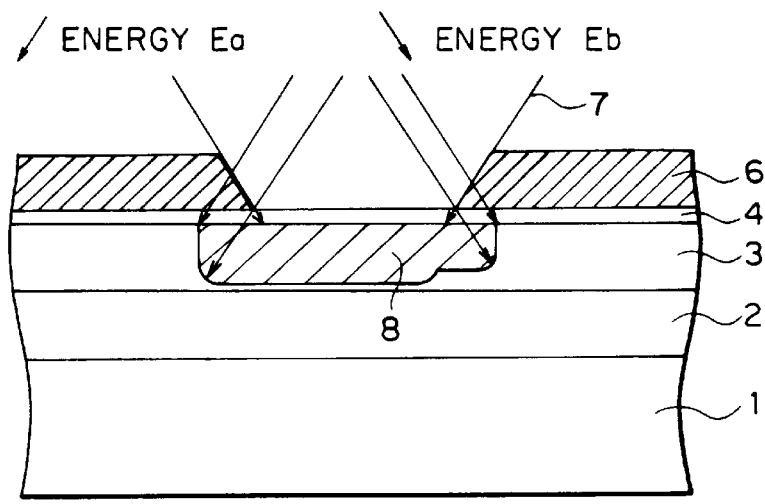
FIGS. 10A–10C are views for description of the effect of the method of the third embodiment.
Figure 10B:
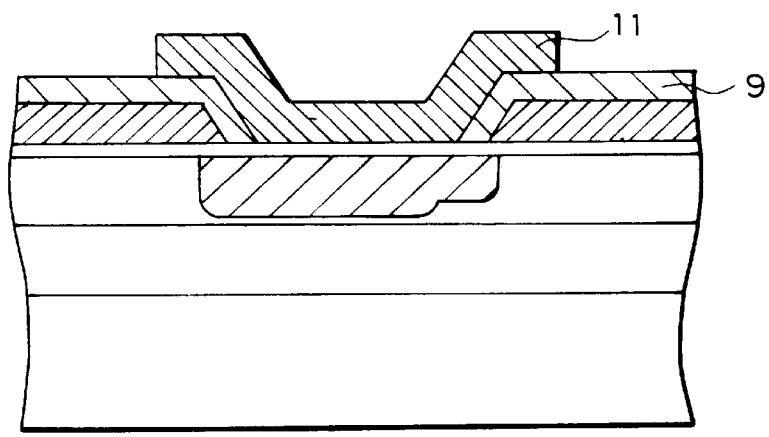
Figure 10C:
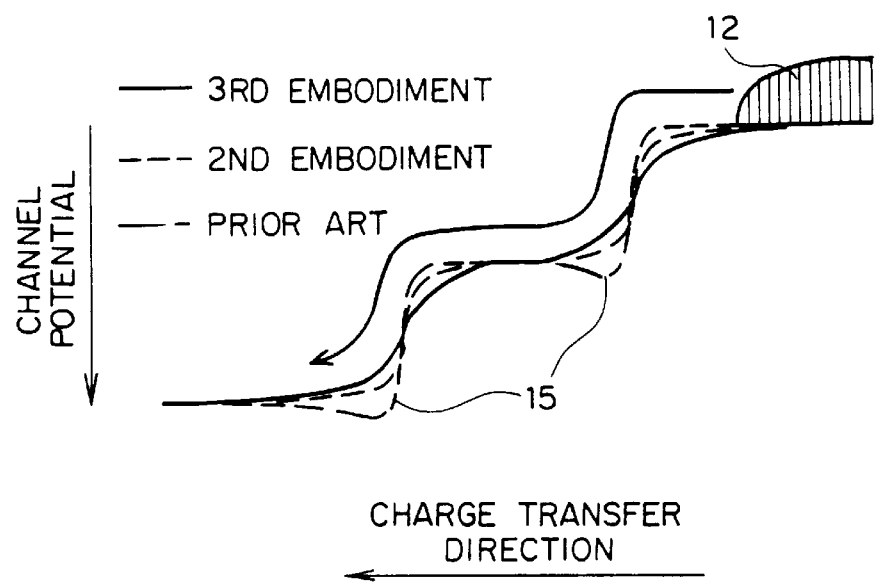

Referring to FIGS. 10A–10C, representing diagramatical cross sectional views In the proximity of one of the N⁻ type potential barrier layers 8 and the channel potential distribution in the charge transfer directions description will be made as regards the effect of the method according to the third embodiment of this invention.

The third embodiment of this invention has the following effect in addition to the effects of the second embodiment described above.

Referring to FIG. 10A, the boron injection is performed obliquely and forwardly in the charge transfer direction under the relatively higher injection energy Ea and is then performed obliquely and reversely in the charge transfer direction under the relatively lower injection energy Eb. Therefore, the boron concentration injected is higher at a channel portion under the inter-electrode space and under a front one of the opposite tapered sidewalls defining the inter-electrode space which is positioned at a front or forward side in the charge transfer direction than at another channel portion under a rear one of the opposite tapered sidewalls defining the Inter-electrode space which is positioned at a rear or reverse side in the charge transfer direction.

Accordingly, after formation of the interlayer insulating layers 9 and the second electrodes 11, the N⁻ type potential barrier layer 8 is formed not only in the channel portion under the second electrode 11 but also in a channel portions 17 under the insulating gap between the first electrode 6 and the second electrode 11, as shown in FIG. 10B. The width of the N⁻ type potential barrier layer 8 is increased or extended into the regions in the channel layer 3 under the opposite tapered sidewalls defining the inter-electrode space. Further, the extended N⁻ type potential barrier layer 8 has a relatively high concentration of P type impurity at a region under the inter-electrode space and under the front tapered sidewall of the first electrode and has a relatively low concentration of P type impurity at a region under the rearward tapered sidewall of the first electrode.

Referring to FIG. 10C, the dip pocket is usually generated at a front side of the interlayer insulting gap between the first and the second electrodes 6 and 11, as described above and shown at the line of the prior art in the figure. However, in the third embodiment where the ion injection energy is higher at the forward injection than at the reverse injection, it is effectively suppressed that the potential dip is generated in the channel layer under the front side of the interlayer insulating gap.

Accordingly, the charge transfer field is fortified as compared with the second embodiment as well as the known CCDs, and the signal charge 12 is more smoothly transferred without being entrapped by the potential dip 15. Thus, there is obtained a CCD operable at a high speed with a low voltage.

The same effect as described above is attained by selecting the larger oblique angle at the forward Injection than at the rearward injection in the charge transfer direction.

EXAMPLE 3

Now, Example 3 of this invention will be described below as an example of the third embodiment.

Example 3 is similar to Example 2 except the difference of the energy and a boron amount for ion-injecting boron as the P-type impurity to form the N⁻ type potential barrier layers 8.

In FIG. 9A the boron injection was carried out under the conditions of an injection energy Ea of 100 keV and an injection amount of $1.4 \times 10^{11} \text{cm}^{-2}$ obliquely at an angle of 30° relative to the direction perpendicular to the substrate. Then, in FIG. 9B, the boron injection was carried out under the conditions of an injection energy Eb of 50 keV and an injection amount of $2.9 \times 10^{11} \text{cm}^{-2}$ obliquely at an angle of 30° relative to the direction perpendicular to the substrate.

Figure 11:
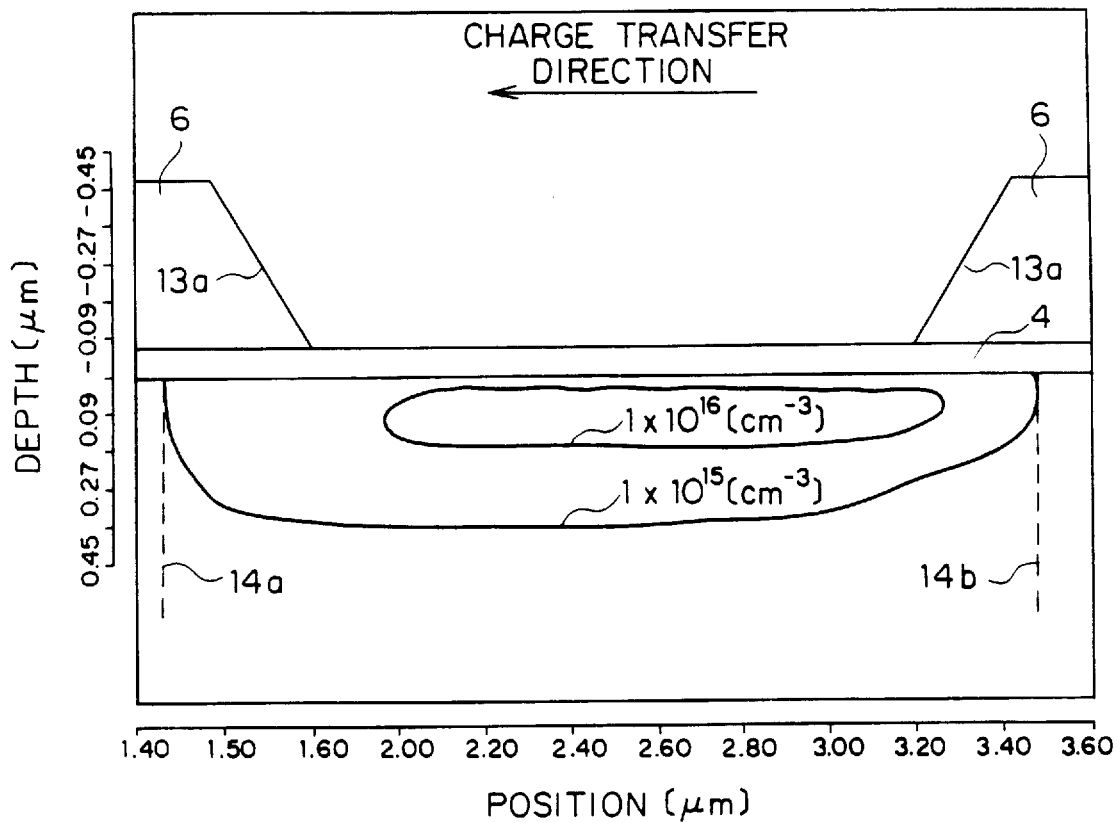
FIG. 11 is a view illustrating a P type impurity concentration distribution in the proximity of an $N^-$ type potential barrier layer by simulation of the CCD of Example 3 of this invention.

Referring to FIG. 11, description will be made as regards a P type impurity concentration distribution in the proximity of the N⁻ type potential barrier layer 8 after the injection of the P type impurity in the CCD of the example 3 of this invention.

In the steps of forming the N⁻ type potential barrier layer 8 in the Example 3, the forward or front sidewall and the rear or rearward sidewall 13*a* of the first electrodes 6 are tapered to define the inter-electrode space therebetween which diverges upwardly from the gate insulator 4, and boron is obliquely injected forwardly at an injection energy Ea and reversely at an injection energy Eb in the charge transfer direction. As a result, a region having a boron concentration of $1.0 \times 10^{15} \text{cm}^{-3}$ has opposite region ends 14*a* and 14*b*. The front or forward one 14*a* of the opposite region ends is positioned at a distance of 0.34 μm forwardly from the front tapered sidewall 13*a*. While, the other rear or rearward one 14*b* is positioned at a distance of 0.27 μm rearwardly from the rear tapered sidewall 13*a*.

Figure 12:
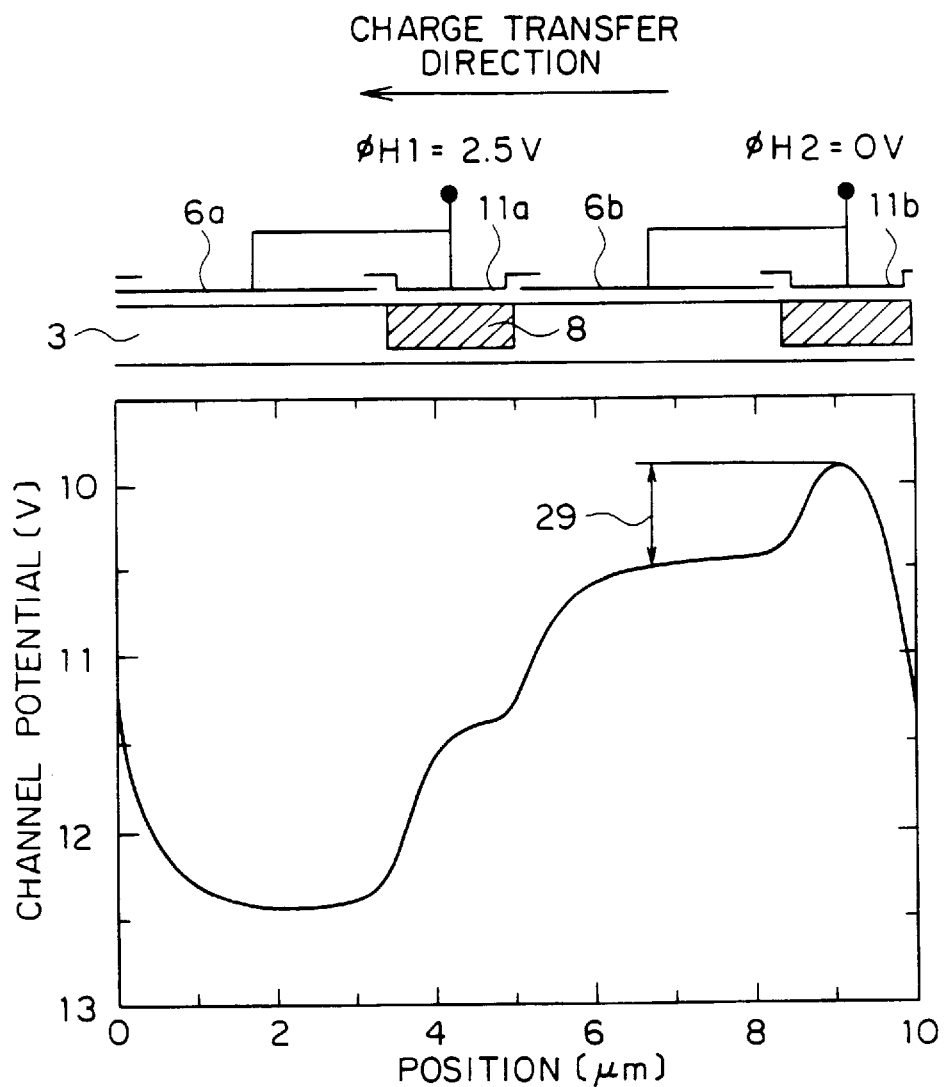
FIG. 12 is a channel potential distribution corresponding to one charge transfer stage by simulation of the CCD of Example 3.

Referring to FIG. 12, a channel potential distribution over one stage of the CCD of Example 3 of this invention is illustrated which is obtained by a simulation where the voltages applied to the transfer electrode pairs are φ H1=2.5 V and φ H2=0 V, the length of one stage is 10 μm, and the potential barrier height 29 formed in the channel layer during perfect depletion is 0.8 V similar to the known examples 1 and 2.

In Example 3, since the oblique injection energy Ea in the forward direction is higher than that Eb in the reverse direction, boron is reliably injected at portions in the channel layer where potential dips tend to be caused. Therefore, no potential dip is generated anywhere in the channel layer, as shown in FIG. 12.

In addition, the transferring electric field is fortified and the time required for one electron to be transferred in a 1/2 stage by the electric field is 318 psec, which is reduced as compared with Example 2.

It will be understood that the CCD of Example 3 of this invention can smoothly transfer the signal charge and can be driven at a high speed with a low voltage in comparison with the example 2.

What is claimed is:

1. A method for producing a charge-coupled device for transferring a signal charge in a charge transfer direction, comprising steps of:

preparing a semiconductor substrate having a substrate surface;

forming a channel layer of a first conduction type in said substrate surface;

forming a gate insulating layer on said channel layer, forming a plurality of first electrodes arranged in a form of strips in said charge transfer direction with inter-electrode spaces between adjacent ones of said first electrodes on said gate insulating film, each of said first electrodes having opposite sidewalls, said sidewalls being tapered to make each of said inter-electrode spaces diverge upwardly on said gate insulating layer;

injecting a second conduction type impurity into said channel layer through said inter-electrode spaces using said first electrodes as a mask to form potential barrier layers having a first conduction type impurity concentration lower than said channel layer, wherein injection of said second conduction type impurity is performed at least two times including a first injection performed obliquely at an angle within an angular range determined by a direction perpendicular to said substrate surface and said tapered sidewalls of said first electrodes and forwardly in said charge transfer direction, and a second injection performed obliquely at an angle within an angular range determined by a direction perpendicular to said substrate surface and said tapered sidewalls of said first electrodes and reversely in said charge transfer direction, wherein injection of said second conduction type impurity is performed with a higher injection energy during the first injection performed forwardly in the charge transfer direction than during the second injection performed reversely the charge transfer direction;

forming insulating layers, as interlayer insulating layers, in surfaces of said first electrodes by thermal oxidation of surfaces of said first electrodes; and forming second electrodes in said inter-electrode spaces of said first electrodes, respectively.

2. A method according to claim 1, wherein injection of said second conduction type impurity is performed obliquely at a larger angle from said direction perpendicular to said substrate surface during performing forwardly than during performing reversely.

3. A method for producing a charge-coupled device for transferring a signal charge in a charge transfer direction, comprising steps of:

preparing a semiconductor substrate having a substrate surface;

forming a channel layer of a first conduction type in said substrate surface;

forming a gate insulating layer on said channel layer, forming a plurality of first electrodes arranged in a form of strips in said charge transfer direction with inter-electrode spaces between adjacent ones of said first electrodes on said gate insulating film, each of said first electrodes having opposite sidewalls, said sidewalls being tapered to make each of said inter-electrode spaces diverge upwardly on said gate insulating layer;

injecting a second conduction type impurity into said channel layer through said inter-electrode spaces using said first electrodes as a mask to form potential barrier layers having a first conduction type impurity concentration lower than said channel layer, the injecting of said second conduction type impurity being performed obliquely at an angle within angular range determined by a direction perpendicular to said substrate surface and said tapered sidewalls of said first electrodes;

forming insulating layers, as interlayer insulating layers, in surfaces of said first electrodes by thermal oxidation of surfaces of said first electrodes; and forming a second electrodes in said inter-electrode spaces of said first electrodes, respectively.

4. A method according to claim 3, wherein, in said injecting step, injection of said second conduction type impurity is performed at least two times, one of which is obliquely at an angle within an angular range determined by a direction perpendicular to said substrate surface and said tapered sidewalls of said first electrodes and forwardly in said charge transfer direction and, while the other being obliquely at an angle within an angular range determined by a direction perpendicular to said substrate surface and said tapered sidewalls of said first electrodes and reversely in said charge transfer direction.

5. A method according to claim 4, wherein injection of said second conduction type impurity is performed obliquely at a larger angle from said direction perpendicular to said substrate surface during performing forwardly than during performing reversely.

* * * * *

UNITED STATES PATENT AND TRADEMARK OFFICE
CERTIFICATE OF CORRECTION

PATENT NO. : 5,849,605
DATED : December 15, 1998
INVENTOR(S) : Tohru Yamada

It is certified that error appears in the above-identified patent and that said Letters Patent is hereby corrected as shown below:

Column 7, Line 10 delete "$1.0 \times 10^{16}$ cm$^{-3}$" and insert --$1.0 \times 10^{15}$ cm$^{-3}$--

Column 10, Line 63 delete "$10 \times 10^{15}$ cm$^{-3}$" and insert --$1.0 \times 10^{15}$ cm$^{-3}$--

Signed and Sealed this

Twenty-ninth Day of June, 1999

Attest:

Q. TODD DICKINSON

Attesting Officer

Acting Commissioner of Patents and Trademarks